US 6,455,579 B1

(12) United States Patent
Satsuki et al.

(10) Patent No.: US 6,455,579 B1
(45) Date of Patent: Sep. 24, 2002

(54) PYRAN DERIVATIVES

(75) Inventors: Makoto Satsuki; Akira Shinpo; Yasuyo Ooga; Sadaharu Suga, all of Okayama; Atsushi Oda, Kanagawa; Hiroshi Tada, Kanagawa; Yoshikazu Sakaguchi, Kanagawa, all of (JP)

(73) Assignee: Kabushiki Kaisha Hayashibara Seibutsu Kagaku Kenkyujo, Okayama (JP)

( * ) Notice: Subject to any disclaimer, the term of this patent is extended or adjusted under 35 U.S.C. 154(b) by 0 days.

(21) Appl. No.: 09/700,032

(22) PCT Filed: Mar. 9, 2000

(86) PCT No.: PCT/JP00/01437

§ 371 (c)(1),
(2), (4) Date: Nov. 9, 2000

(87) PCT Pub. No.: WO00/53598

PCT Pub. Date: Sep. 14, 2000

(30) Foreign Application Priority Data

| Mar. 9, 1999 | (JP) | ............................................. 11-61922 |
| Jul. 12, 1999 | (JP) | ........................................... 11-197297 |
| Mar. 8, 2000 | (JP) | ......................................... 2000-63867 |

(51) Int. Cl.$^7$ ..................... A61K 31/353; C07D 311/16
(52) U.S. Cl. ........................ 514/457; 514/459; 514/460; 549/284; 549/288; 549/289
(58) Field of Search ................................ 549/284, 288, 549/289; 514/457, 459, 460

(56) References Cited

U.S. PATENT DOCUMENTS 4,769,292 A 9/1988 Tang et al.

FOREIGN PATENT DOCUMENTS

| JP | A-23-901/88 | 2/1988 |
| JP | A-64-33104/89 | 2/1989 |
| JP | A-6-329 654/94 | 11/1994 |
| JP | A-10-60427/98 | 3/1998 |

OTHER PUBLICATIONS

Kaoru Igarashi, "Dyes for Dye Laser", Shikizai–Kyokai–Shi, 1997. pp. 102–111, vol. 70, No. 2, Chiba Inst. Technology, Japan.

Kondo, Toshikazu et al., :"Photopolymerization Initiators for Photosensitive Resign Compositons," Chemical Abstracts, 1980, p. 610, vol. 92., 92:159901t.

Mitsubishi Chemical Industries Co., Ltd., "Photopolymerizing Compositions," Chemical Abstrcts. 1983, p. 37, vol. 99, 99:159417g.

Mitsubishi Chemical Industries Co., Ltd. "Photopolymerizable Compositions," Chemical Abstracts, 1984, p. 82, vol. 101, 101:112543q.

DATABASE WPI, Section Ch, Week 199549, Derwent Publications, Ltd., London, GB; Class A60, AN 1995–380258, XP002187970: Abstract for JP 07 258566 A (NIPPON KANKOH SHIKISO KENKYUSHO KK), Oct. 9, 1995.

Primary Examiner—T. A. Solola
(74) Attorney, Agent, or Firm—Browdy and Neimark

(57) ABSTRACT

Disclosed are pyran derivatives, which have distinctive sensitivity to visible light and distinctive luminous ability. The derivatives are useful in photopolymerization, electroluminescence, and dye lasers, and are obtainable through a step of reacting a compound having a 4-cyanomethylene-2-methyl-4H-pyran skeleton with a compound having a 3-formylcoumarin skeleton.

7 Claims, 2 Drawing Sheets

PYRAN DERIVATIVES

The present application is the national stage under 35 U.S.C. 371 of PCT/JP00/01437, filed Mar. 9, 1999.

TECHNICAL FIELD

The present invention relates to functional organic compounds, and more particularly, to novel pyran derivatives which are useful in photochemical polymerization, dye laser, and electroluminescence.

BACKGROUND ART

After coming into this information age, photochemical polymerization has been frequently used in a variety of fields, and beyond the bounds of the field of synthetic resins, it is being extensively used in other fields of information recordings and electric equipments such as paints, plates for printings, printing circuits, integrated circuits, etc. Photochemical polymerization, a technique for polymerizing polymerizable compounds by irradiating light, is classified roughly into photopolymerization where polymerizable compounds are initiated to be polymerized and activated by directly irradiating light, an photosensitizing polymerization where polymerizable compounds are polymerized by irradiating light in the presence of photosensitizers to form growth active-cores of photosensitizers. The photochemical polymerizations have characteristics that the initiation and suspension of polymerization can be controlled by flashing excitation light, and the polymerization rate and degree can be easily controlled by selecting the strength and wavelength of excitation. Photochemical polymerization can be proceeded even at relatively-low temperatures because its polymerization-initiating-energy is relatively low.

At present, owing to the above characteristics of photopolymerization, there are rapidly arising demands for photopolymerizable compositions, which can be polymerized by irradiating visible light such as argon ion lasers, helium/neon lasers, and second harmonic of YAG lasers, with the development of new information recordings such as plates for printings and holographs. However, since conventional polymerizable compounds and polymerization initiators to be incorporated in photopolymerizable compositions selectively absorb ultraviolet rays, photopolymerizable compositions inevitably require photosensitizers as an essential technical factor when they are polymerized by irradiating visible light. Accordingly, in photopolymerizable compositions used in information recordings and electric equipments, polymerizable compounds should be used in combination with photosensitizers, polymerization initiators, binding resins, etc., which are all selected from various materials dependently on their uses. In general, methods comprising the steps of selecting materials for polymerizable compounds and/or polymerization initiators other than photosensitizers, and then screening photosensitizers which may appropriately sensitize the selected materials through trials and errors.

The characteristics required in photosensitizers are a relatively-large molecular extinction coefficient in the visible region; an ability of sensitizing polymerizable compounds and polymerization initiators; a higher sensitization efficiency; a superior solubility in solvents and compatibility with other components; and a satisfactory stability. Such photosensitizers include, for example, merocyanine dyes as disclosed in Japanese Patent Kokai No. 151,024/79, cyanine dyes as disclosed in Japanese Patent Kokai No. 29,803/83, stilbene derivatives as disclosed in Japanese Patent Kokai No. 56,403/84, coumarin derivatives as disclosed in Japanese Patent Kokai No. 23,901/88, pyran derivatives as disclosed in Japanese Patent Kokai No. 329,654/94, and methylene blue derivatives as disclosed in Japanese Patent Kokai No. 33,104/89. These photosensitizers, however, have unignorable disadvantages and remarkable advantages. There has been found no photosensitizer which consistently exerts the above characteristics in photo-polymerizable compositions containing appropriate materials.

Organic compounds sensitive to light, particularly, luminescent organic compounds are useful in the field of dye lasers and electroluminescence.

In the field of dye lasers, as disclosed, for example, by Kaoru IGARASHI in "*Shikizai-Kyokai-shi*", Vol. 70, No. 2, pp. 102–111 (1997), compounds which give luminescence in the visible region have been eagerly screened since the report of dye laser's lasing in 1960's. As the progress of information recording technology, there are arising demands for compounds which give luminescence in a longer wavelength region, more particularly, in the visible region.

In the field of information displays, electro-luminescent devices (hereinafter abbreviated as "EL devices") are highlighted as displaying devices for the forthcoming generation. Nowadays, cathode-ray tubes are predominantly used in a relatively large size of information displaying means such as computer termini and TV receivers. The cathode-ray tubes are, however, relatively large in mass and weight and relatively high in operation voltage, thus the tubes are inadequate for consumer's equipments and small-sized equipments where portability is an important factor. In the small-sized equipments, display devices which have a depthless, light and plain form; and operate at a relatively-low operation voltage and wattage, are required. Because of the advantageous characteristics of a relatively-low operation voltage and wattage, liquid crystal devices are now widely used in various fields. However, because the contrast changes depending on view angles in the information displaying means using the liquid crystal devices, informations can be clearly displayed only when viewed within a specific view angle and the wattage is not effectively reduced as much as expected because they generally need backlight. A device, which is now focused as a displaying device for overcoming the drawbacks as described above, is an organic electro-luminescent device or an organic EL device.

Organic EL device is a luminescent device which is formed by inserting a thin layer containing a luminescent agent between a cathode and an anode, and which utilizes luminescence such as fluorescence or phosphorescence emitted by the luminescent agent when a dc voltage is first supplied between the cathode and the anode to supply positive holes and electrons to the thin layer and to rebind the positive holes and the electrons in order to bring the luminescent agent into an excited state, and then the excited agent returns to the ground state. As a characteristic, organic EL device is appropriately changeable its luminous color tint by selecting appropriate host luminescent agents and changing guest luminescent agents as dopants used in combination with the host luminescent agents. Dependently on the combinations of the host and guest luminescent agents, the brightness and the life expectancy of luminescence can be improved by a large margin. It is said that organic EL device is a theoretically-excellent luminescent device, because it gives luminescence in itself and information displaying means therewith are free of view angles and low in energy consumption because it needs no backlight.

Although, in organic EL device which gives luminescence in green region, there has been reported an improvement of luminescent efficiency by incorporating guest luminescent agents, but it has been found no guest luminescent agent which effectively allows organic EL device to give luminescence in red region and it still remains far from emitting a pure red luminescence, poor in life expectancy, and insufficient in both durability and reliability. For example, the organic EL devices disclosed in Japanese Patent Kokai No. 60,427/98 and U.S. Pat. No. 4,769,292 are insufficient in brightness and impure in red-color emission, and hence they have still problems in realizing full-color emission.

To supply organic EL devices at a lower cost, it is essential to find luminescent agents which do not intrinsically need doping by guest luminescent agents, make them simple the systematic structure of the organic EL devices and facilitating the step of vapor deposition in their preparations. Although various proposals have been made on luminescent agents in organic EL devices, there have been found no compound which fulfills the requirements as described above.

DISCLOSURE OF INVENTION

In view of the foregoing, the objects of the present invention are to provide organic compounds which absorb and/or emit lights in the visible region as well as to provide their uses in photochemical polymerization, organic EL devices, and dye lasers.

To solve the above objects, the present inventors eagerly screened compounds and researched and found that the pyran derivatives, which are obtainable through the step of reacting a compound having 4H-pyran skeleton with a compound having 3-formylcoumarin skeleton, have an absorption maximum in the visible region and substantially absorb visible light, and therefore they are very useful in photochemical polymerization. They also found that the pyran derivatives obtainable through such a step is very useful in dye lasers and organic EL devices because the pyran derivatives have the luminescent maxima in the visible region and emit visible light when excited.

More particularly, the present inventors confirmed that the pyran derivatives of the present invention emit at a high efficiency visible light, particularly, a light in red region when used in compounds for composing organic EL devices, in particular, when used in materials for composing luminescent layers of organic EL devices. The present invention was made on the basis of the creation of novel pyran derivatives and the findings of their industrially-useful features.

Figure 1:
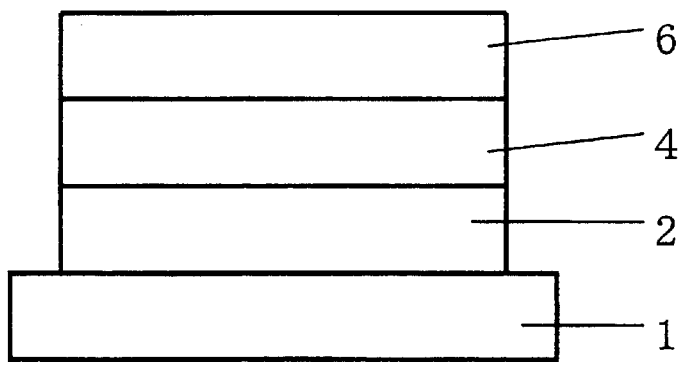
FIG. 1 is a brief figure of one organic EL device according to the present invention.

Throughout FIGS. 1 to 4, reference numerals 1 to 6 represent a substrate, anode, hole injection/transportation layer, luminous layer, electron injection/transportation layer, and cathode, respectively.

BEST MODE FOR CARRYING OUT THE INVENTION

The present invention relates to pyran derivatives represented by either of the following Formulae 1 and 2:

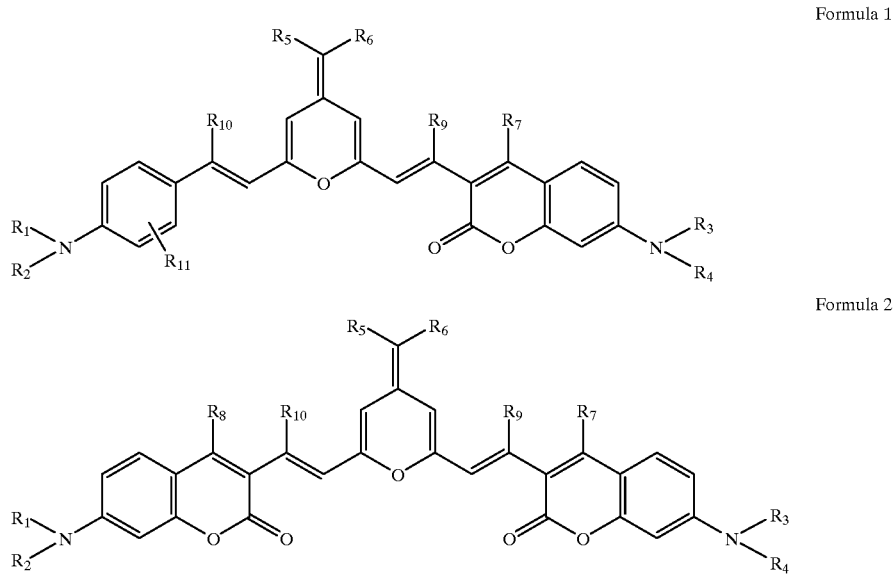

Formula 1

Formula 2

In Formulae 1 and 2, $R_1$ to $R_4$ independently represent a straight- or branched-chain of alkyl, alkenyl or aromatic hydrocarbon group which may contain one or more substituents. Dependently on uses, when $R_1$ to $R_4$ are alkyl groups, their chain lengths are usually selected from those up to 20 carbon atoms, desirably, 1 to 18 carbon atoms. Such alkyl groups include, for example, methyl, ethyl, n-propyl, isopropyl, n-butyl, isobutyl, sec-butyl, tert-butyl, n-pentyl, isopentyl, neopentyl, 1-methylpentyl, 2-methylpentyl, 3-methylpentyl, n-hexyl, isohexyl, cyclohexyl, 2-ethylhexyl, 5-ethylhexyl, n-heptyl, n-octyl, n-nonyl, n-decyl, n-dodecyl, and n-octadecyl groups. Such alkenyl group include, for example, vinyl, 1-propenyl, 2-propenyl, isopropenyl, 2-butenyl, and 1, 3-butadienyl groups; Such aromatic hydrocarbon groups include, for example, phenyl, tolyl, xylyl, biphenyl, naphthyl, anthryl, and phenanthryl groups. Such substituents for these alkyl, alkenyl and aromatic hydrocarbon groups include, for example, halogens such as fluorine, chlorine, bromine, and iodine; alkoxy groups such as methoxy, ethoxy, propoxy, and buthoxy groups; alkoxycarbonyl groups such as alkylcarboxy groups, methoxycarbonyl, ethoxycarbonyl groups, etc; carboxy, sulfonyl, alkylsulfonyl, aminosulfonyl, hydroxy, aromatic carbohydroxy, cyano, phenylmethyl, 4-butylphenylmethyl, 4-butoxyphenylmethyl, 2-hydroxyethyl, 2-cyanoethyl, 2-carboxyethyl, 2-butoxyethyl, 2-(2-ethoxy)ethoxyethyl, 3-sulfoxypropyl, 4-sulfoxybutyl, 6-bromohexyl, and cycloalkyl groups. $R_1$ and $R_2$, or $R_3$ and $R_4$ may form a five- or six-membered cyclic structure in cooperation with the nitrogen atom bonded thereunto or the benzene ring bonded to the nitrogen atom.

In Formulae 1 and 2, $R_5$ and $R_6$ independently represent cyano or alkyl halide; substituents such as ester, acyl and amido groups which are derived from carboxy group or carbonic acid; or monocyclic or heterocyclic groups which comprise one or more hetero atoms such as nitrogen, oxygen, sulfur, and selenium. Such heterocyclic groups include, for example, thiazolyl, benzothiazolyl, naphtothiazolyl, benzoxazolyl, naphtoxazolyl, imidazolyl, benzoimidazolyl, napthoimidazolyl, and triazolyl groups. These heterocyclic groups may have one or more substituents such as halogens, alkyl, alkoxy, aromatic hydrocarbons, carboxy, sulfonic acid, organic acid esters, nitro, cyano, and alkyl halides such as trifluoroalkyl group.

Furthermore, in Formulae 1 and 2, $R_7$ and $R_8$ independently represent hydrogen; halogens such as fluoro, chloro, bromo, or iodo; cyano group; alkyl or halogenated alkyl group having up to six carbon atoms; or substituents derivable from carboxy group or carbonic acid, such as alkoxycarbonyl, acyl, and amido groups; where the alkyl group may have a straight-, cyclic-, or branched-chain structure or a substituent such as a halogen. In Formulae 1 and 2, $R_9$ to $R_{11}$ independently represent hydrogen or lower alkyl group such as methyl, ethyl, or propyl group. The present invention includes cis/trans isomers of the pyran derivatives represented by Formula 1 or 2.

Concrete examples of the pyran derivatives represented by Formulae 1 and 2 are the compounds represented by the following Chemical Formulae 1 to 55. All of these pyran derivatives have absorption maxima and substantially absorb visible light, therefore they can be advantageously used in photosensitizers to photochemically polymerize polymerizable compounds. The pyran derivatives, which have luminescent maxima in visible region and emit visible light when excited, are very useful as laser-active substances in dye lasers, organic compounds which compose organic EL devices, particularly, host luminescent agents which form luminescent layers of organic EL devices, and guest luminescent agents to improve their luminescent efficiency and luminescent spectra by doping other host luminescent agents.

Chemical Formula 1

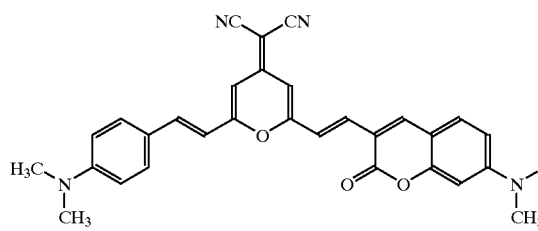

Chemical Formula 2

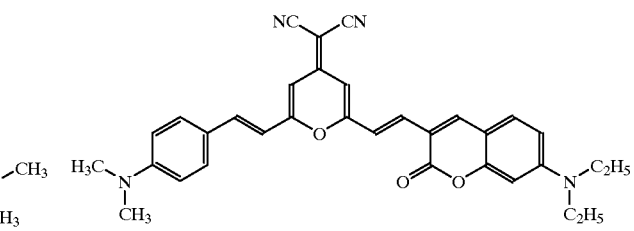

Chemical Formula 3

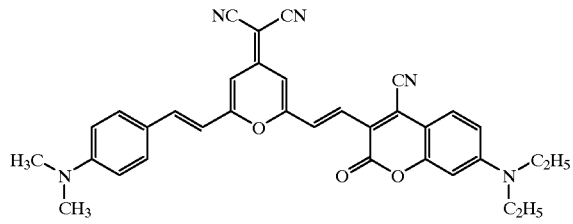

Chemical Formula 4

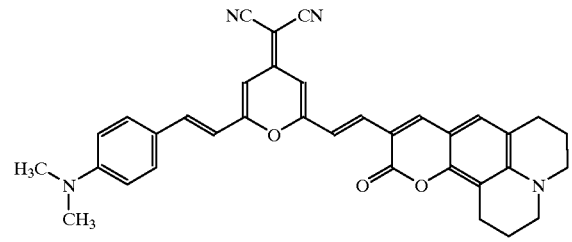

Chemical Formula 5

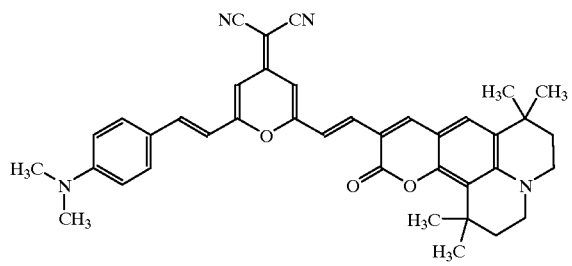

Chemical Formula 6

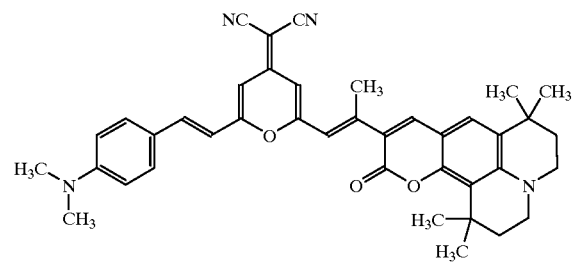

-continued
Chemical Formula 7
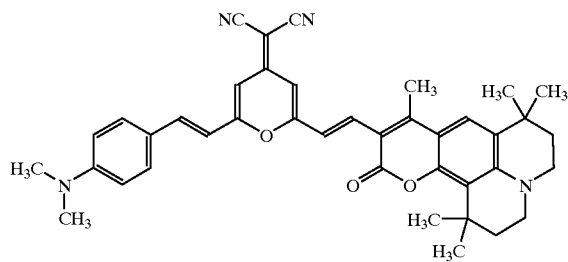
Chemical Formula 8
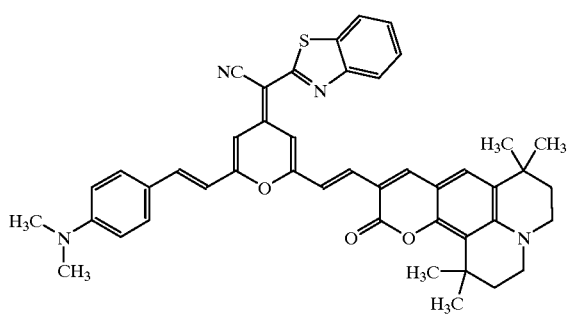
Chemical Formula 9
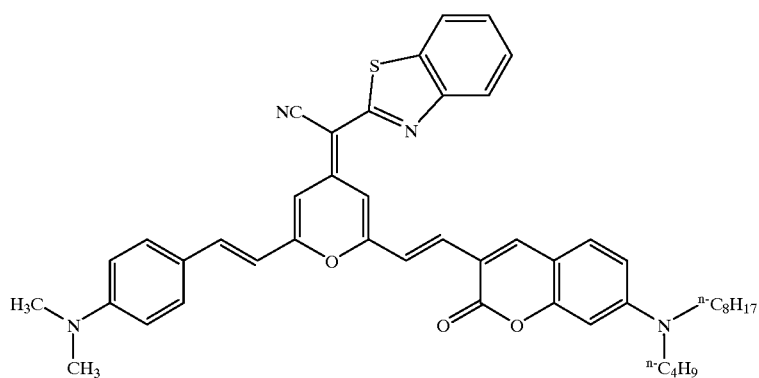
Chemical Formula 10
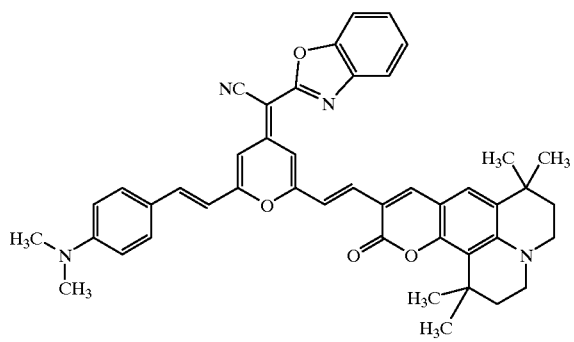
Chemical Formula 11
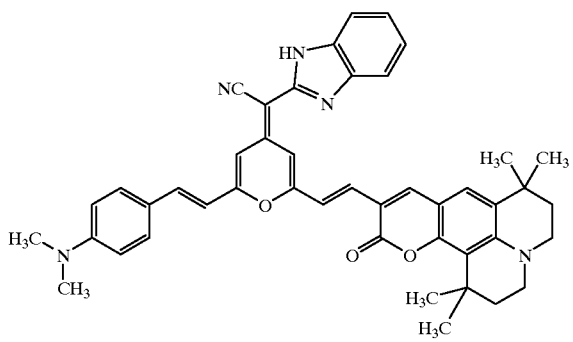
Chemical Formula 12
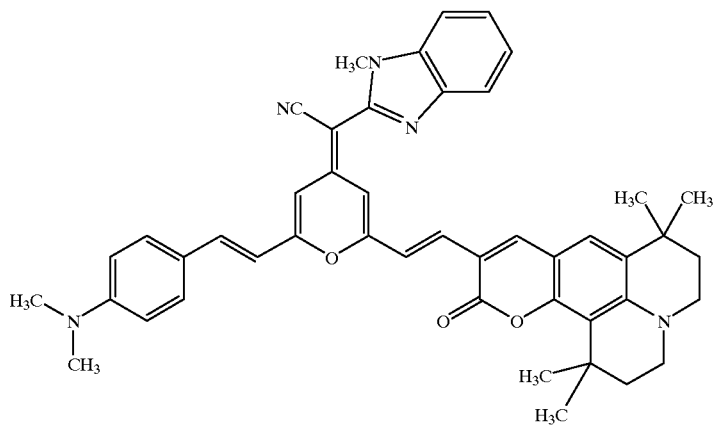

Chemical Formula 13
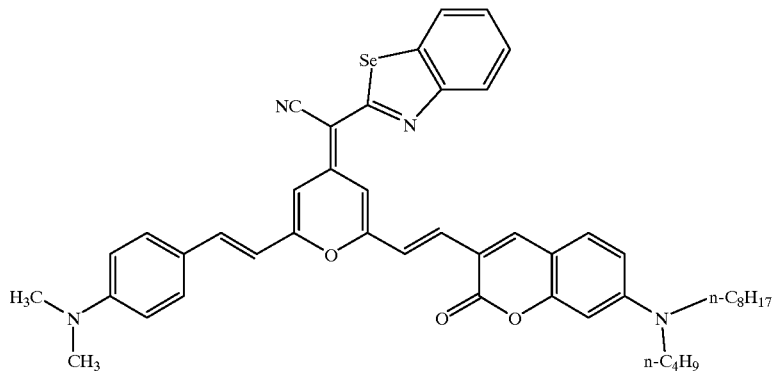
Chemical Formula 14
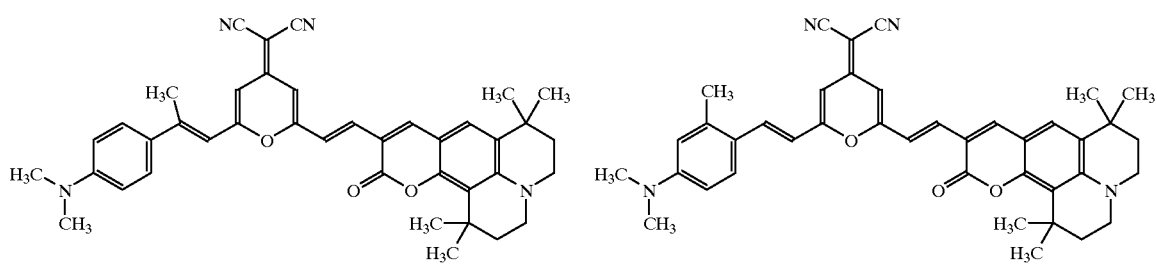
Chemical Formula 15
Chemical Formula 16
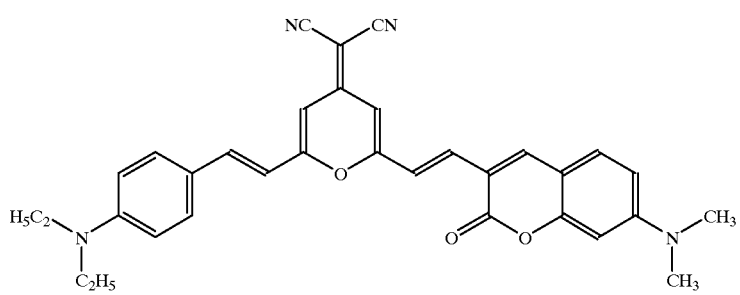
Chemical Formula 17
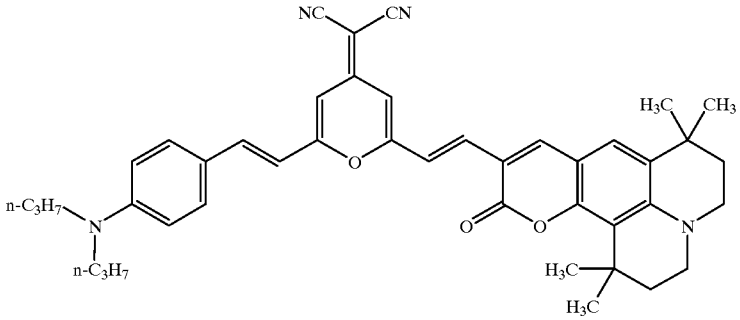
Chemical Formula 18
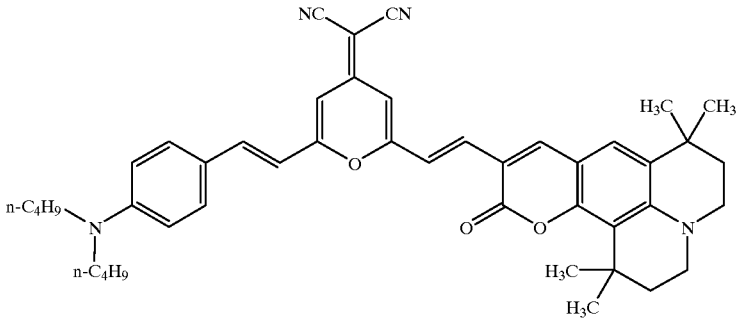

Chemical Formula 19
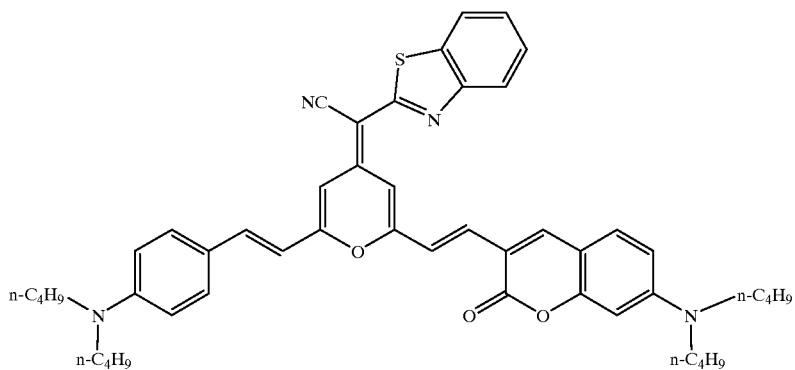
Chemical Formula 20
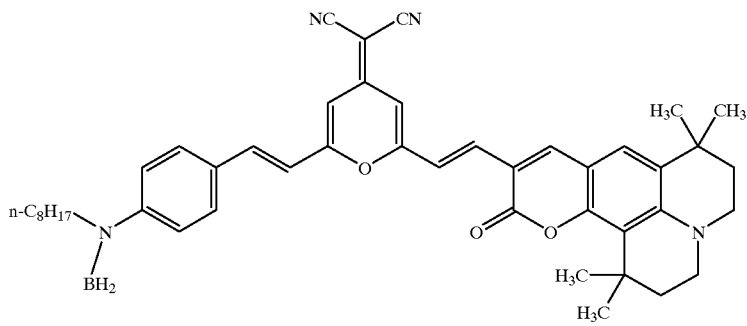
Chemical Formula 21
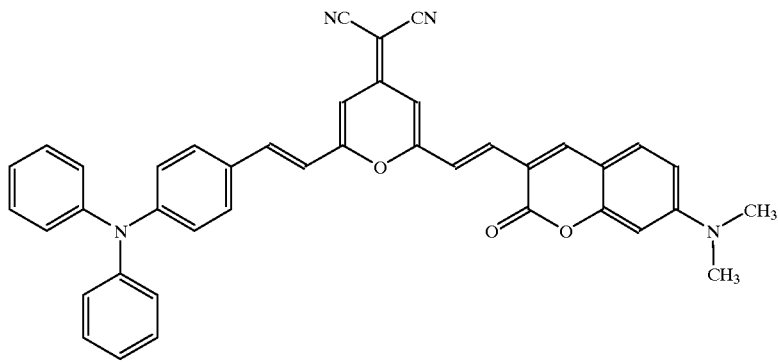
Chemical Formula 22 Chemical Formula 23
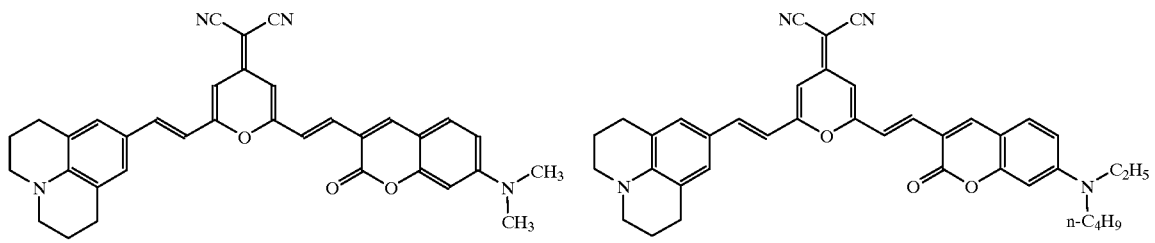

-continued
Chemical Formula 24
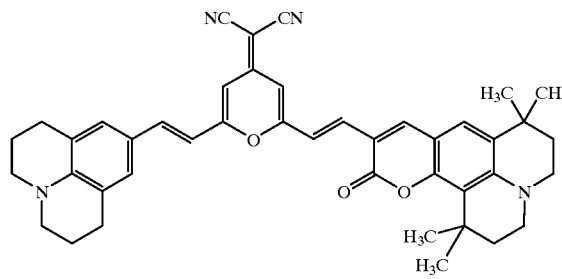
Chemical Formula 25
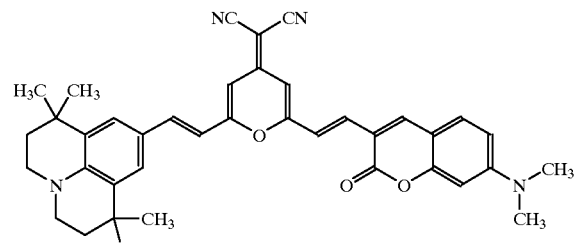
Chemical Formula 26
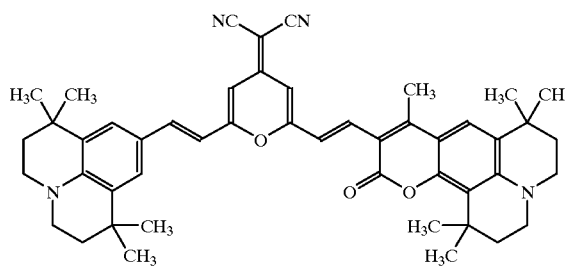
Chemical Formula 27
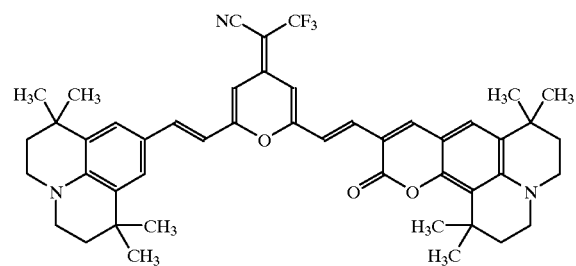
Chemical Formula 28
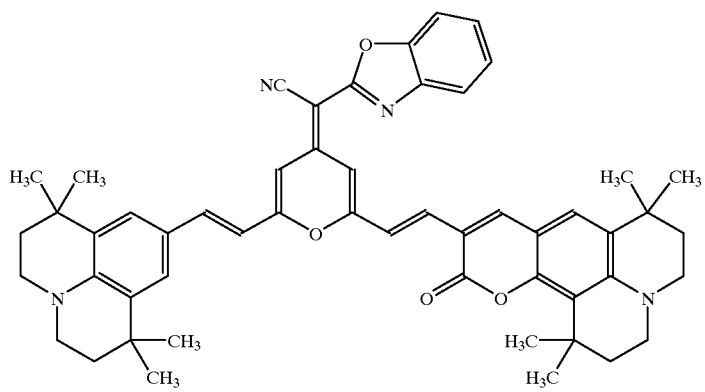
Chemical Formula 29
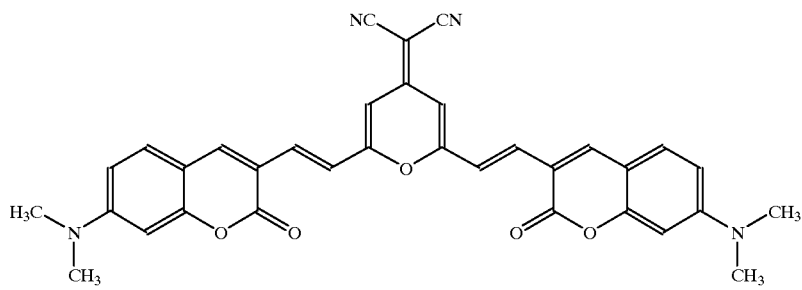

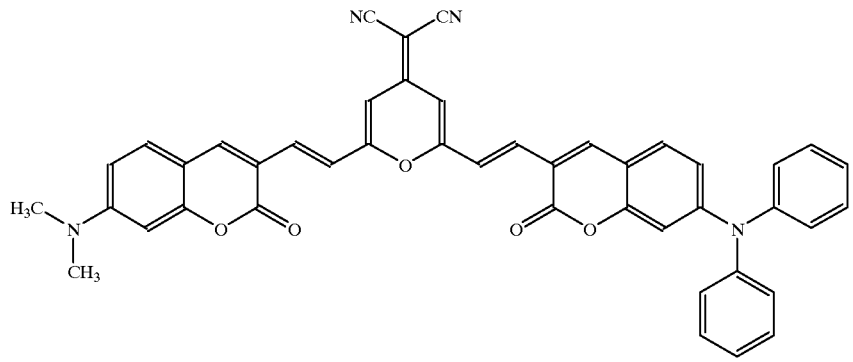
Chemical Formula 30
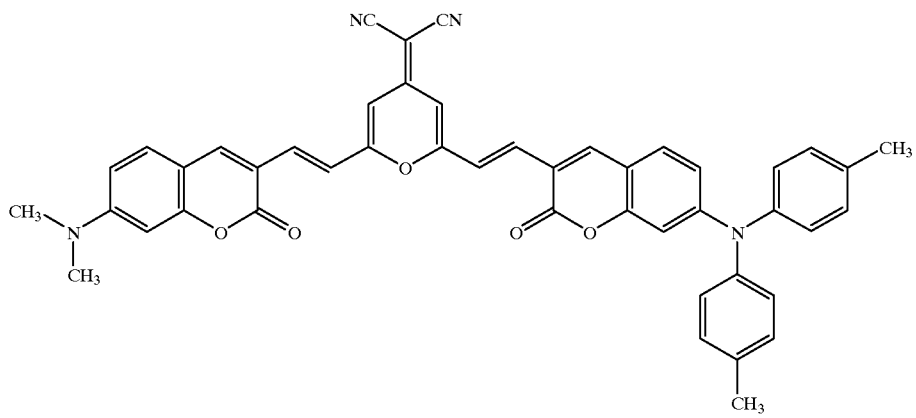
Chemical Formula 31
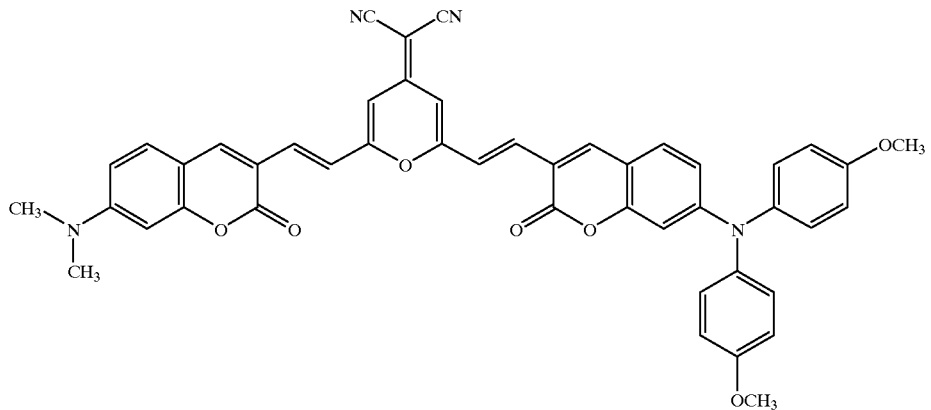
Chemical Formula 32
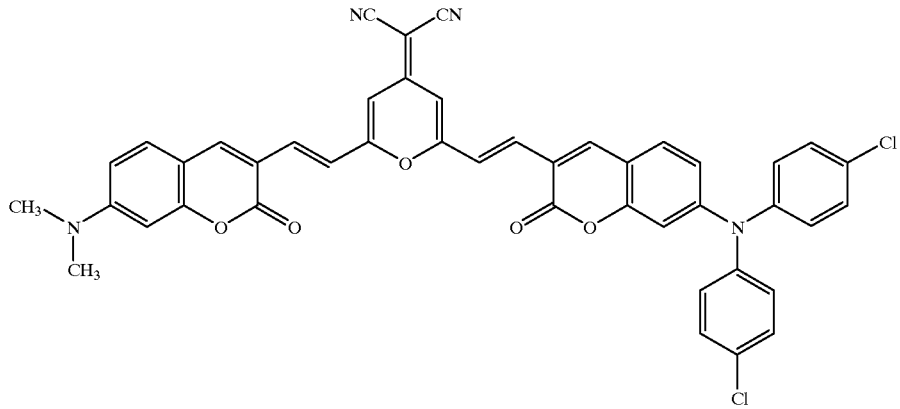
Chemical Formula 33

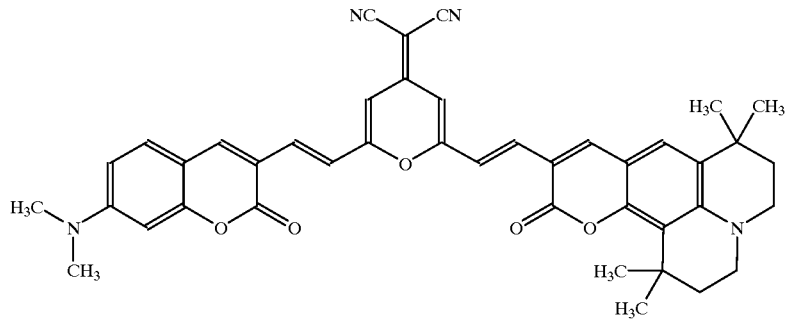
Chemical Formula 34
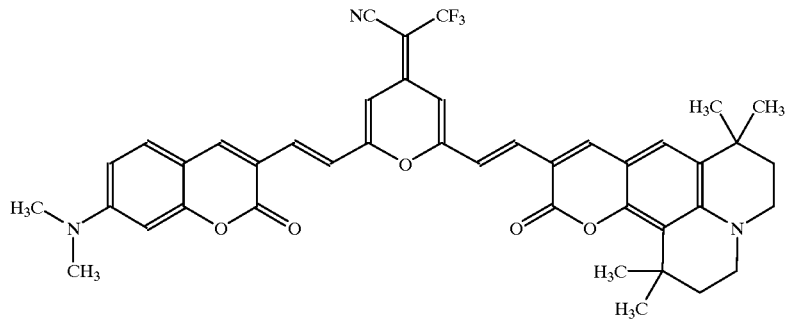
Chemical Formula 35
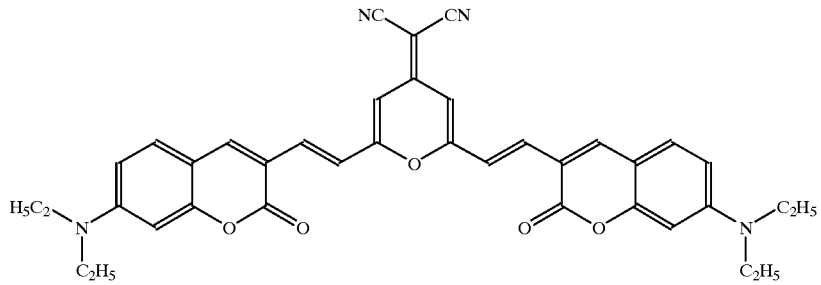
Chemical Formula 36
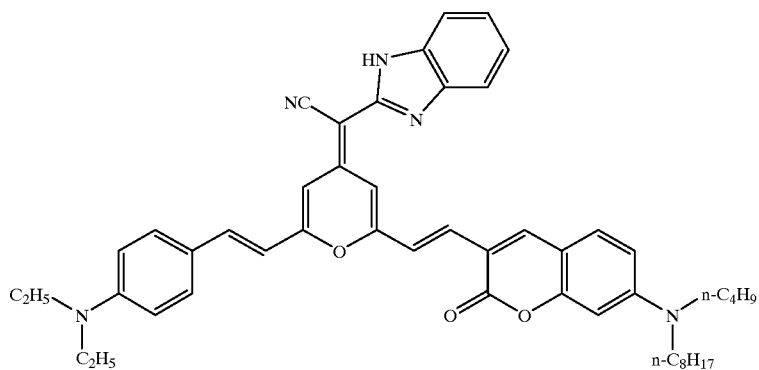
Chemical Formula 37

-continued
Chemical Formula 38
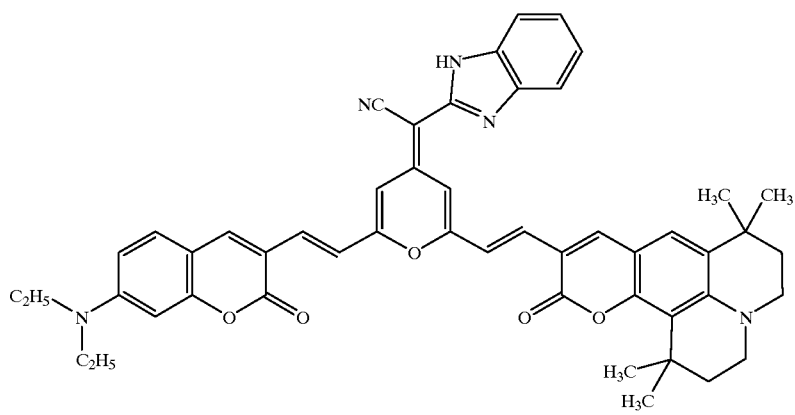
Chemical Formula 39
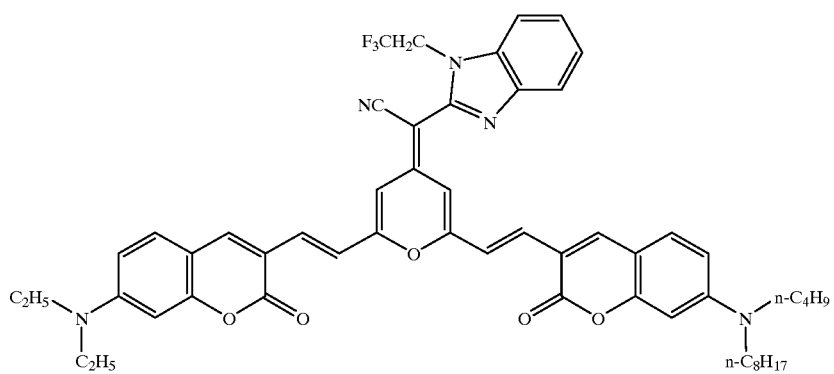
Chemical Formula 40
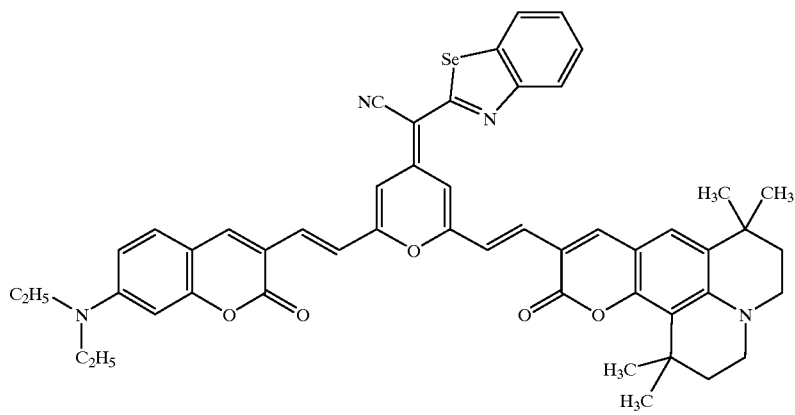
Chemical Formula 41
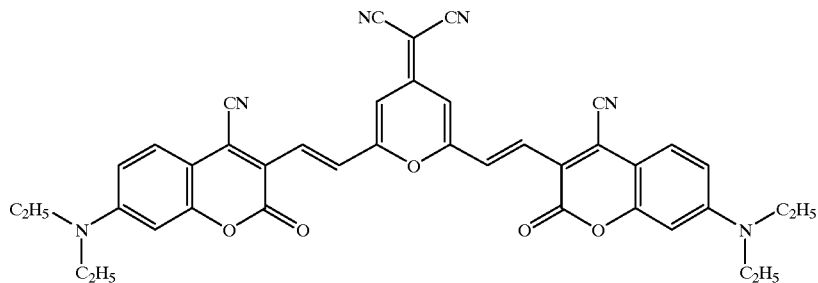

Chemical Formula 42
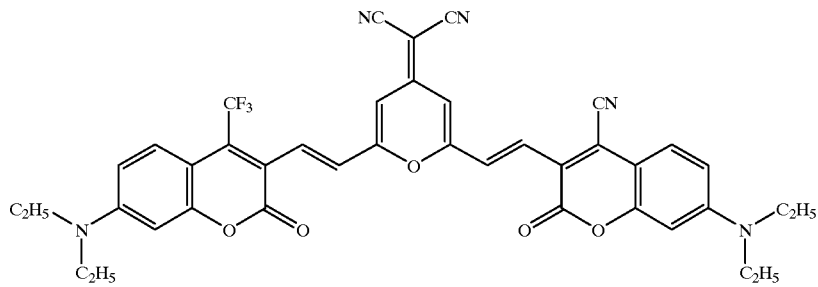
Chemical Formula 43
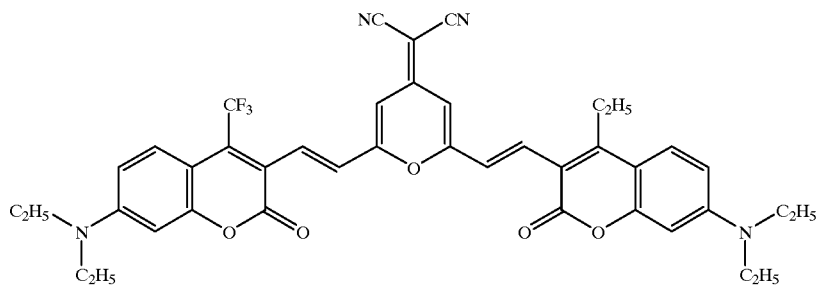
Chemical Formula 44
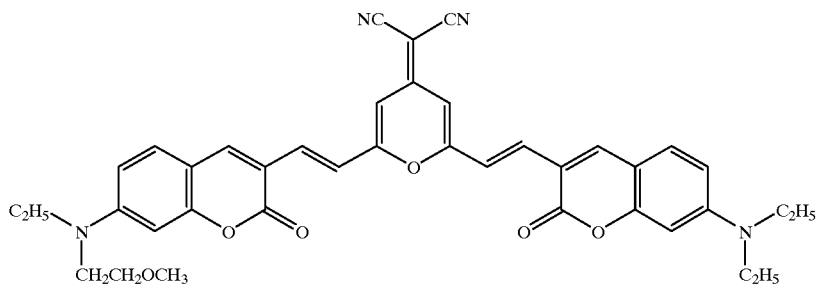
Chemical Formula 45
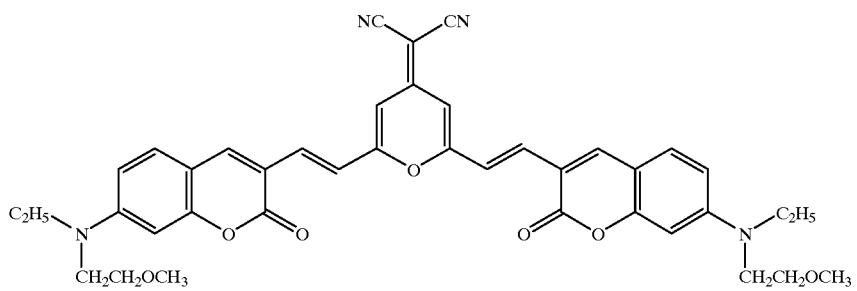
Chemical Formula 46
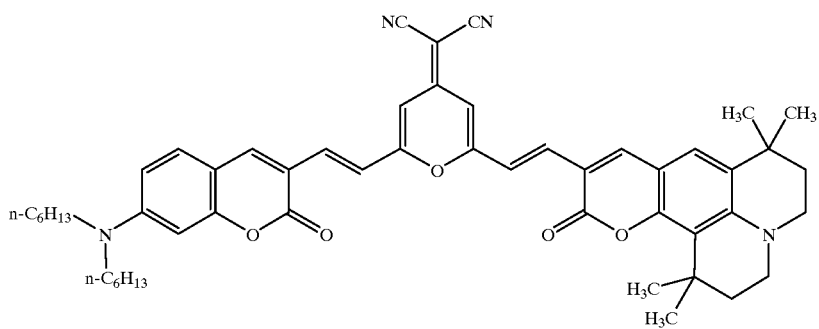

-continued
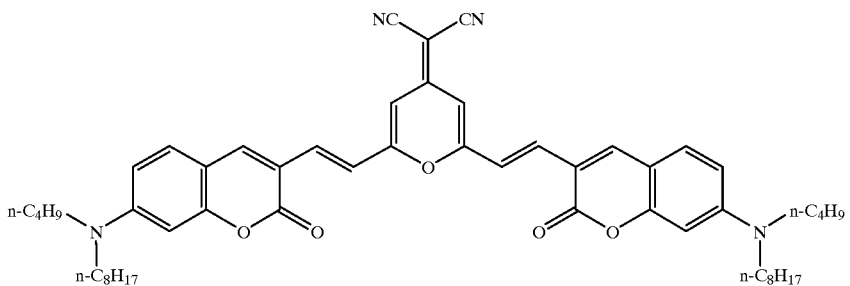
Chemical Formula 47
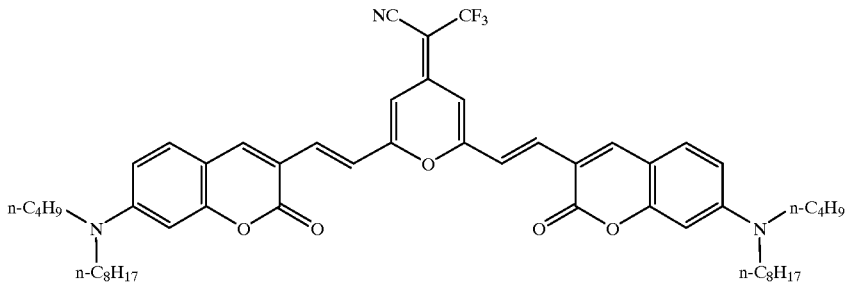
Chemical Formula 48
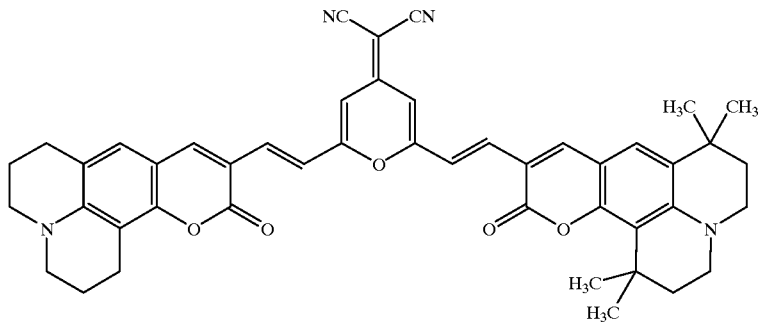
Chemical Formula 49
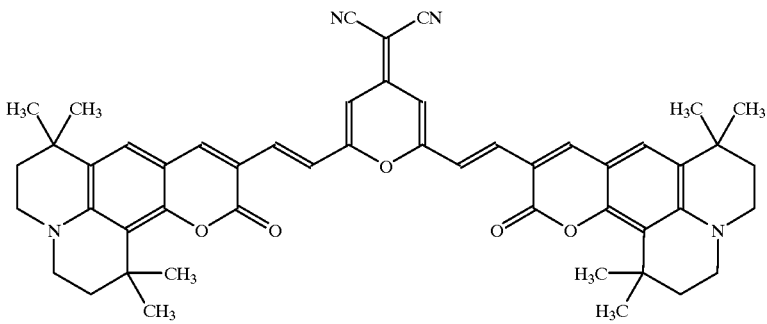
Chemical Formula 50
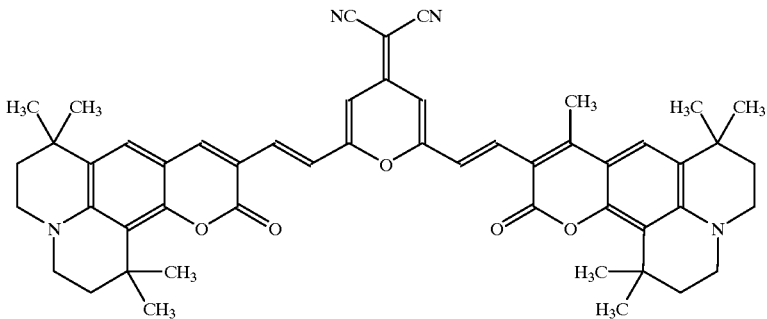
Chemical Formula 51

-continued
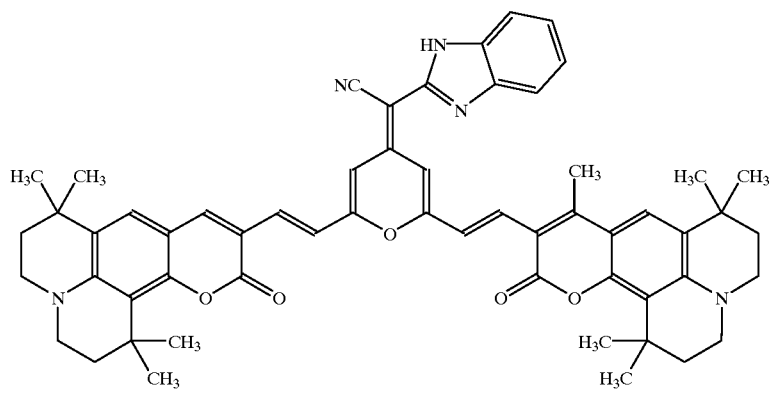
Chemical Formula 52
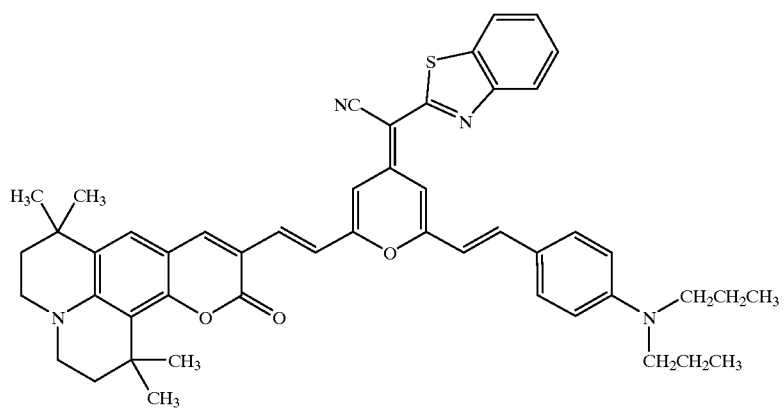
Chemical Formula 53
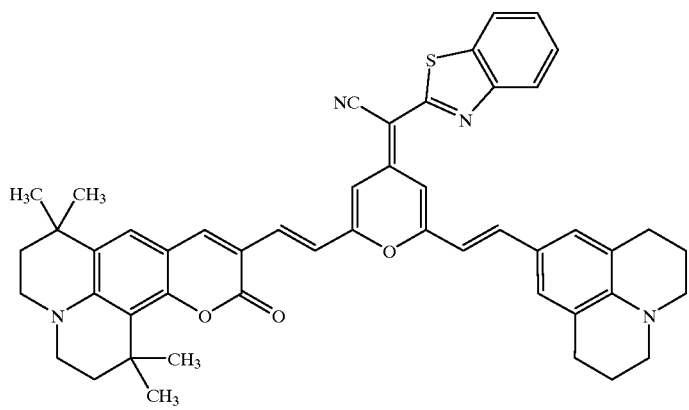
Chemical Formula 54
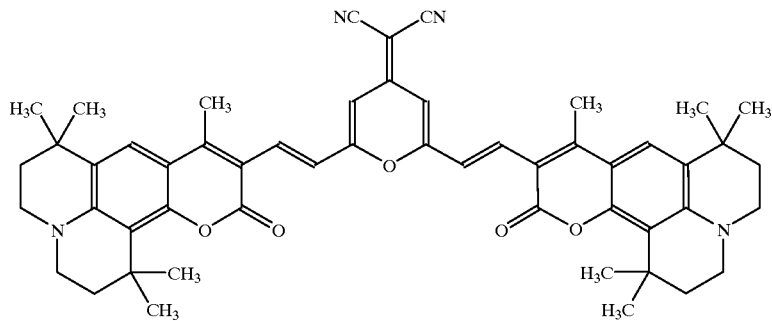
Chemical Formula 55

The pyran derivatives of the present invention can be prepared by various methods. The following methods can be preferably used in economical view point: A method to produce the pyran derivative represented by Formula 1 through the step of reacting a compound represented by Formula 3 having $R_1$, $R_2$, $R_5$, $R_6$, $R_{10}$ and $R_{11}$ in Formula 1 with a compound represented by Formula 4 having $R_3$, $R_4$, $R_7$ and $R_9$ in Formula 1 in an appropriate solvent in the presence of a basic compound such as piperidine, pyridine, N,N-dimethylaniline, or triethylamine; and a method to produce the pyran derivative represented by Formula 2 through either a step of reacting a compound represented by Formula 5, having $R_1$, $R_2$, $R_5$, $R_6$, $R_8$ and $R_{10}$ in Formula 2, with a compound represented by Formula 4 having $R_3$, $R_4$, $R_7$ and $R_9$ in Formula 2 in an appropriate solvent in the presence of a basic compound such as piperidine, pyridine, N,N-dimethylaniline, or triethylamine; or a step of reacting a compound represented by Formula 6, having $R_5$ and $R_6$ in Formula 2, with a compound represented by Formula 4 having $R_3$, $R_4$, $R_7$ and $R_9$ in Formula 2 and a compound represented by Formula 7 having $R_1$, $R_2$, $R_8$ and $R_{10}$ in Formula 2 in an appropriate solvent in the presence of a similar basic compound as used above. In the method to react compounds represented by Formula 6 with compounds represented by Formulae 4 and 7, the pyran derivatives of the present invention, which bind the same substituents at the C-2 and C-6 positions of 4H-pyran ring, are obtained when single compounds are used as compounds represented by Formulae 4 and 7. The pyran derivatives represented by chemical Formulae 1 to 55 can be prepared by these methods.

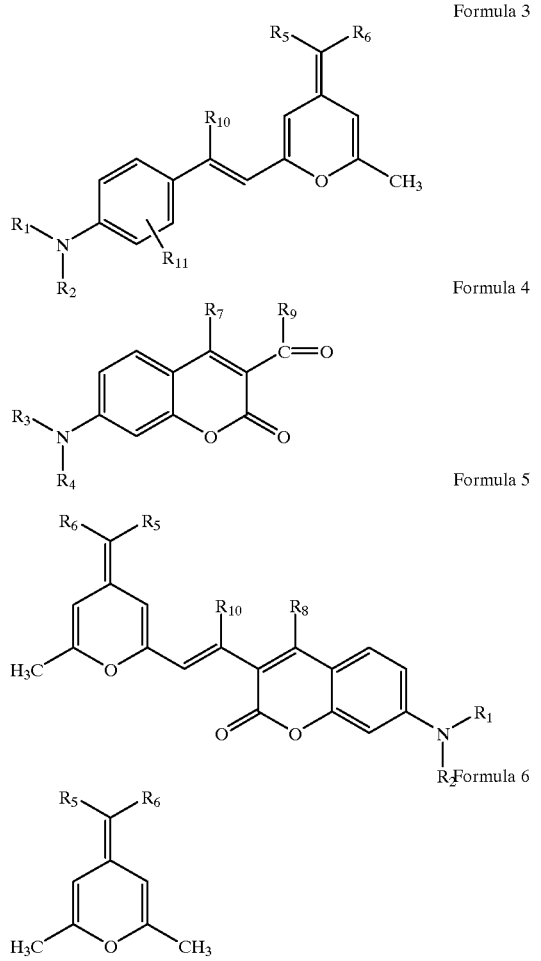

Formula 3

Formula 4

Formula 5

Formula 6

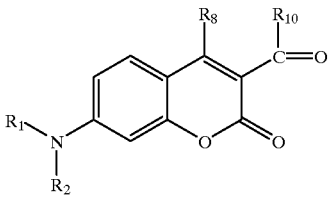

Formula 7

The pyran derivatives thus obtained can be used intact in a reaction mixture form dependently on uses, however, prior to use, they are usually purified by conventional methods generally used in the purification of analogous compounds, for example, separation, decantation, filtration, concentration, thin-layer chromatography, column chromatography, gas chromatography, high-performance liquid chromatography, distillation, sublimation, and crystallization, which can be used in combination, if necessary. When used in photosensitizers, the pyran derivatives would preferably be at least distilled and/or crystallized prior to use, while when used in laser-active substances for laser oscillating devices and in luminescent agents for organic EL devices, the pyran derivatives would preferably be further purified, for example, by a method such as sublimation.

As described above, since the pyran derivatives of the present invention substantially absorb visible light, particularly, longer wavelength of light, and have characteristics that they sensitize various polymerizable compounds and polymerization initiators, they can be very useful as photosensitizers to polymerize photochemically the polymerizable compounds by using light with longer wavelengths than ultraviolet ray, particularly, by using visible light. In use, the pyran derivatives of the present invention are usually preparable into compositions in combination with polymerizable compounds, polymerization initiators, and/or binding resins. However, depending on the kinds of the pyran derivatives and the final use of photopolymerizable compounds, polymerization initiators, and/or binding resins can be omitted.

The polymerizable compounds, to which the photosensitizers of the present invention can be applied, are, for example, monomers, oligomers, prepolymers, and mixtures thereof, which contain at least one polymerizable multiple bond such as an ethylenic-double-bond. Such polymerizable compounds include, for example, ethylacrylate, hydroxyethylacrylate, ethylene glycol dimethacrylate, pentaerythritol triacrylate, pentaerythritol trimethacrylate, polyester methacrylate, polyurethane methacrylate, and epoxymethacrylate. However, the polymerizable compounds, which are incorporated into the photopolymerizable compositions of the present invention, should not be restricted to the above compounds and include all polymerizable compounds which can be photochemically polymerized by using the photosensitizers of the present invention.

Examples of the polymerization initiators are organic peroxides such as di-t-butyldiperoxyisophthalate, 3,3',4,4'-tetrakis(t-butyldioxycarbonyl)benzophenone, ethylmethylketone, 2,5-dimethyl-2,5-bis(t-butyldioxy)-3-hexane, di-t-butylperoxide, 2,5-bis(hydroperoxy)-2,5-dimethylhexane, t-butylhydroperoxide, butyl-4,4-bis(t-butyldioxy)valylate, and 1,1-bis(t-butyldioxy)-3,3,5-trimethylcyclohexane; halogenated hydrocarbons such as 2,4,6-trichloromethyl-s-triazine; bisimidazol; benzoylalkylether; iron-allene complexes; titanocene compounds; N-phenylglycine, and diphenyliodonium salts, which are polymerization initiators conventionally used in photopolymerization and which can be used in combination, if necessary.

Dependently on uses, any binding resins, which are generally used in photopolymerizable compositions, can be used in the present invention. Such binding resins are, for example, poly-N-vinylpyrrolidone, poly(vinyl acetate), poly(vinyl butyral), poly(vinyl carbazole), polystyrene, poly(methyl methacrylate), poly(ethylene oxide), poly(butyl methacrylate), styrene-maleic acid ester, poly(methyl methacrylate)-methacrylic acid, and poly-N-vinylpyrrolidone-glycidyl methacrylate.

The photosensitizers of the present invention include one or more of the pyran derivatives of the present invention. Usually, to obtain photopolymerizable compositions by using photosensitizers of the present invention, they can be prepared by incorporating into one part by weight of any of the photosensitizers of the present invention 1–1,000 parts by weight, and preferably 10–500 parts by weight of any of the aforesaid polymerizable compounds; and if necessary, further incorporating into the mixtures any of the aforesaid binding resins in an amount up to 1,000 parts by weight, and preferably up to 500 parts by weight, and further incorporating into the resulting mixtures any of the aforesaid polymerization initiators in an amount of 0.1–10 parts by weight, and preferably 0.5–5 parts by weight. In addition, the following quinonoid or phenolic thermopolymerization inhibitors such as hydroquinone, pyrogallol, and 2,6-di-t-butyl-p-cresol; and plasticizers such as saturated- or unsaturated-carboxylic esters including phthalic acid esters and adipic acid esters, colorants, preservatives, stabilizers, surface protectants, smoothers, and coating aids can be appropriately added to the above photopolymerizable compositions.

Usually, the photopolymerizable compositions of the present invention can be used by dissolving in appropriate solvents into solutions, coating the solutions over supporting means appropriately, and drying the coated means. As the solvents, the followings can be used: Hydrocarbons such as pentane, hexane, cyclohexane, petroleum ether, petroleum benzine, isooctane, benzene, toluene, and xylene; halides such as carbon tetrachloride, chloroform, 1,2-dichloroethane, 1,2-dibromoethane, trichloroethylene, tetrachloroethylene, chlorobenzene, and α-dichlorobenzene; alcohols and phenols such as methanol, ethanol, 1-propanol, 2-propanol, 2,2,2-trifluoroetahnol, 1-butanol, 2-butanol, isobutyl alcohol, isopentyl alcohol, cyclohexanol, ethylene glycol, propylene glycol, 2-methoxyethanol, 2-ethoxyethanol, phenol, benzyl alcohol, cresol, diethylene glycol, triethylene glycol, and glycerin; ethers such as diethyl ether, diisopropyl ether, tetrahydrofuran, tetrahydropyran, 1,4-dioxane, anisole, 1,2-dimethoxyethane, diethylene glycol dimethyl ether, dicyclohexyl-18-crown-6, methylcarbitol, ethylcarbitol, propylene glycol monomethyl ether, and propylene glycol monomethyl ether acetate; ketones such as acetone, ethyl methyl ketone, and cyclohexanone; esters such as ethyl acetate, butyl acetate, amyl acetate, ethyl propionate, ethylene carbonate, propylene carbonate, and phosphoric trimethyl; amides such as formamide, N-methyformamide, N,N-dimethylformamide, N-methylacetamide, N,N-dimethylacetamide, and hexamethyl phosphoric triamide; nitriles such as acetonitrile, propionitrile, succinonitrile, and benzonitrile; nitro compounds such as nitromethane and nitrobenzene; amines such as ethylenediamine, pyridine, piperidine, and morpholine; and sulfur-containing compounds such as dimethylsulfoxide and sulfolane. These solvents can be arbitrarily used in combination, if necessary.

Any support means generally used in this field can be used in the present invention. Such support means are, for example, metals such as aluminum, magnesium, copper, zinc, chromium, nickel, and iron; alloy sheets thereof; papers such as high-quality papers, art papers, and exfoliative papers; inorganic sheets such as glasses and ceramics; and plastic sheets such as polyethylene phthalate, polyethylene, poly(methyl methacrylate), poly(vinyl chloride), copolymer of vinyl chloride-vinylidene chloride, polystyrene, nylon, cellulose acetate, and cellulose acetate butylate.

The polymerization method used in the present invention is not specifically restricted and, for example, it can be photoinitiation polymerization where light participates only in the initiation stage of radical-, ion-, and ring opening-polymerizations for polymerizable compounds; or may be photo-polyaddition polymerization where light participates in the propagation stage of polymerizable compounds. The exposure illuminants usable in the present invention are conventional illuminants, for example, visible light with wavelengths of more than 400 nm such as sun light, carbon arcs, mercury lamps, xenon lamps, metalhalide lamps, luminescent lamps, tungsten lamps, argon ion lasers, krypton ion lasers, helium-cadmium lasers, helium-neon lasers, and the second harmonic wavelength by YAG laser.

The present invention also provides the uses as luminous agents of the pyran derivatives in organic EL devices. Since most of the pyran derivatives of the present invention have luminescent maxima such as fluorescent maxima in the visible region at wavelengths of more than 600 nm, particularly, in the red region at wavelengths of 610 to 730 nm, the pyran derivatives can be advantageously useful as luminous agents for organic EL devices.

The luminous agents for organic EL devices of the present invention can be advantageously used both in monolayer- and laminate-types of organic EL devices. The action of the organic EL devices essentially comprises the step of injecting electrons and holes from an electrode, allowing the electrons and the holes to transport through solid members, forming singlet or triplet excitons by rebinding the electrons and the holes, and allowing the excitons to emit. These steps do not intrinsically differ both in the monolayer- and the laminate-types of organic EL devices. However, in general, the laminate-type organic EL devices attain desirable properties easier than those of the monolayer-type because the functions required in each step can be allowed to share by plural materials and optimized separately for each material in the laminate-type organic EL devices, while in the monolayer-type organic EL devices the properties of the aforesaid four steps can be improved only by changing the molecular structure of luminescent agents.

Figure 2:
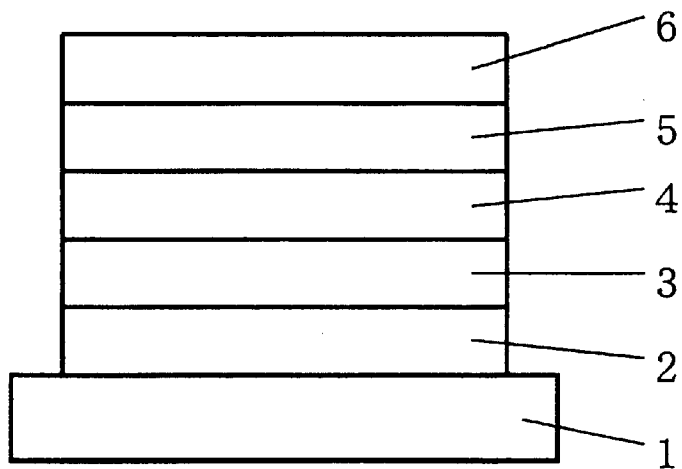
FIG. 2 is a brief figure of another organic EL device according to the present invention.
Figure 3:
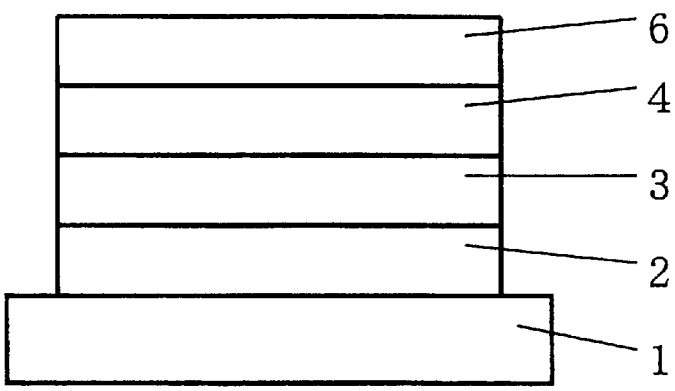
FIG. 3 is a brief figure of the other organic EL device according to the present invention.
Figure 4:
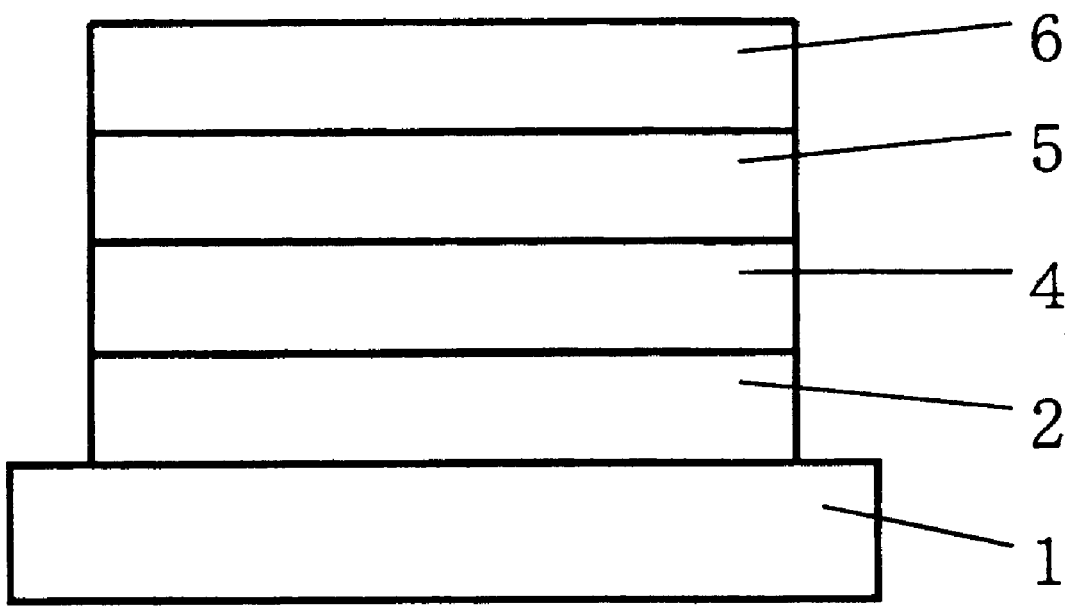
FIG. 4 is a brief figure of another organic EL device according to the present invention.

Now explaining the organic EL devices of the present invention with reference to a laminate-type organic EL device, the organic EL device, as shown in FIG. 1, is essentially composed of anode 2 to be energized with positive voltage, cathode 6 to be energized with negative voltage, and luminous layer 4 to give luminescence by rebinding holes and electrons. The organic EL device may have hole injection/transportation layer 3 which accelerates the injection and transportation of holes from anode 2, and/or electron injection/transportation layer 5 which accelerates the injection and transportation of electrons from cathode 6, as shown in FIGS. 2 to 4, if necessary. In FIGS. 1 to 4, the reference numeral 1 represents a substrate, i.e., a substrate in general including glasses such as soda glass, barium boron silicate glass, and aluminosilicate glass; plastics; or ceramics. A preferable substrate is a transparent glass or plastic, and an opaque ceramic such as silicon can be used in combination with a transparent electrode.

The reference numeral 2 represents an anode which is usually formed by attaching closely to either surface of substrate 1 by a method such as vacuum deposition, molecular beam deposition, chemical deposition (CDV), immersion, spin-coating, bar-coating, roll-coating, casting, or spattering, and then coating thereupon a metal or an electric conductive material, which is electrically low in resistivity and high in transmissivity over visible region, into a thin layer having a thickness of 10–1,000 nm, desirably, 50–500 nm to give a resistivity of anode 21 kΩ/□. The following compounds can be used in the electric conductive materials in the present invention: Metals such as gold, platinum, aluminum, and nickel; metal oxides such as tin oxide, indium oxide, and mixture systems of tin oxide and indium oxide (hereinafter abbreviated as "ITO"); and electric conductive oligomers or polymers which have aniline, thiophene or pyrrole as a repeating unit. Among these, ITO has a characteristic of being easily processed into low-resistive ones and etched with acids to easily form minute patterns.

The reference numeral 3 represents a hole injection/transportation layer which is usually formed by attaching closely to anode 2 by the same methods as used in anode 2 to make a material for hole injection/transportation layer into a thin layer having a thickness of 1–1,000 nm. In the hole injection/transportation layer, desirably used are materials which give a hole mobility of at least $10^{-6}$ cm$^2$/V·sec under electric fields of $10^4$ to $10^6$ V/cm and a relatively-low ionized electric potential. Such materials include, for example, aromatic tertiary amine, styryl amine, triazole derivatives, pyrazoline derivatives, pyrazolone derivatives, phenylenediamine derivatives, allylamine derivatives, amine substituted chalcone derivatives, oxazole derivatives, styryl anthracene derivatives, fluorenone derivatives, hydrazone derivatives, stilbene derivatives, and so-called "star burst type molecules", which all can be arbitrarily used in combination, if necessary. The materials for hole injection/transportation layer include, for example, bis[di(p-tolyl)aminophenyl]-1,1-cyclohexane, N,N'-diphenyl-N,N'-bis(3-methylphenyl)-1,1'-biphenyl-4,4'-diamine, and N,N'-diphenyl-N,N'-bis(1-naphthyl)-1,1'-biphenyl)-4,4'-diamine.

Chemical Formula 56

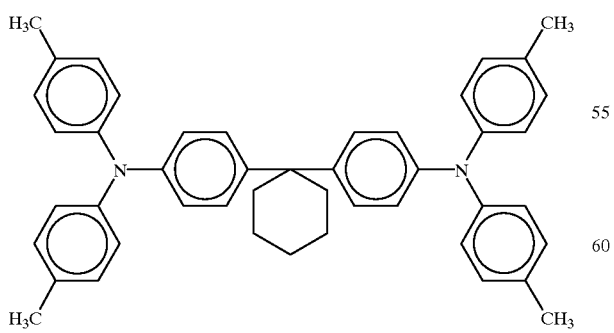

Chemical Formula 57

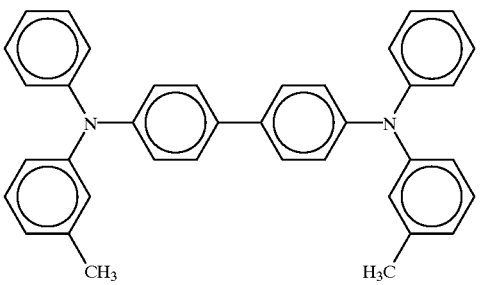

Chemical Formula 58

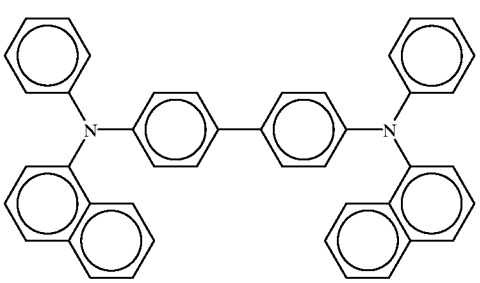

Chemical Formula 59

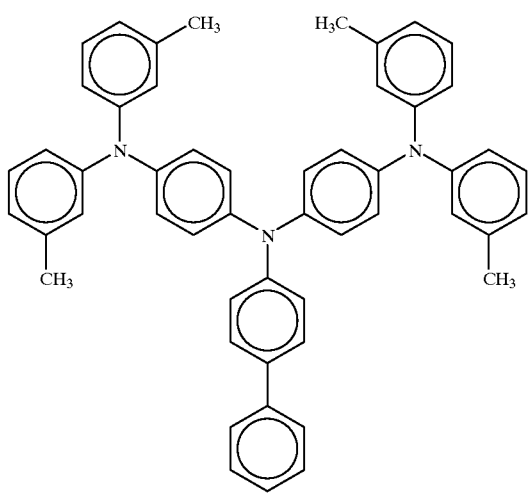

Chemical Formula 60

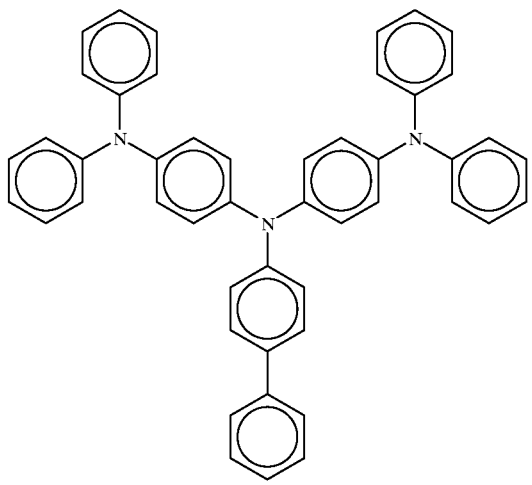

-continued

Chemical Formula 61

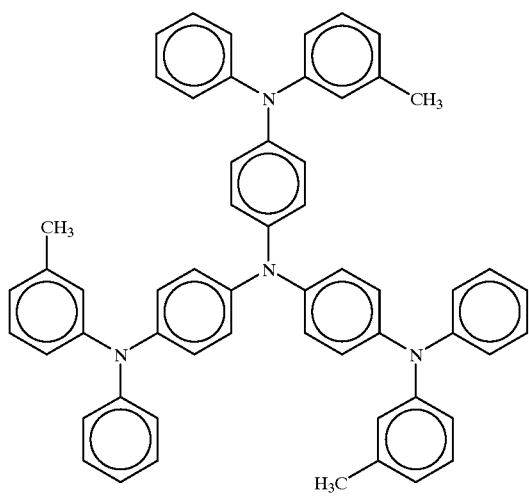

The reference numeral 4 represents luminous layer which is usually formed by attaching closely to hole injection/transportation layer 3, and then, by the same method as used in anode 2, coating thereupon the pyran derivative of the present invention alone or in combination with an appropriate host luminescent agent to form a thin monolayer or separated two-layers having, usually, a thickness of 1–1,000 nm, preferably, 10–200 nm. Though the pyran derivatives of the present invention per se exert high luminous efficiency, they effectively suppress the quenching of concentration of host luminescent agents and exert a higher luminous efficiency when doped in an appropriate amount to the host luminescent agents. The doping amount of the pyran derivatives of the present invention is usually 0.1–30% by weight, desirably, 1–10% by weight, and it may be varied depending on the kind of the host luminescent agents. The host luminescent agents used in combination with the pyran derivatives of the present invention are, for example, the following compounds represented by Formulae 8 to 13.

Formula 8

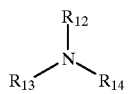

Formula 9

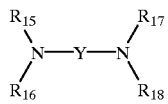

Formula 10

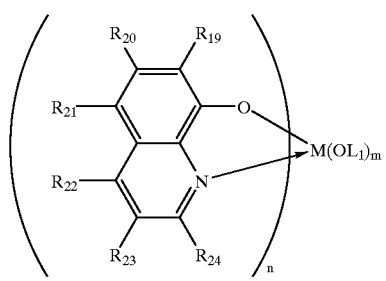

Formula 11

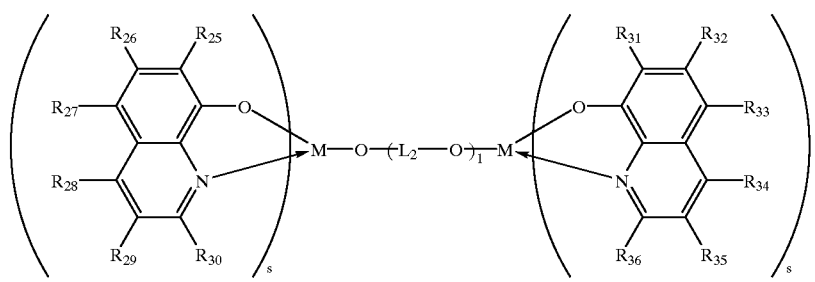

Formula 12

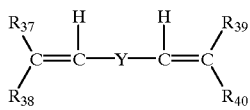

Formula 13

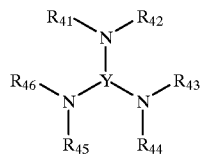

In Formula 8, all of $R_{12}$ to $R_{14}$ independently represent an aromatic hydrocarbon group or aromatic heterocyclic group, which may contain a substituent and bind each other to form a cyclic structure.

In Formula 9, all of $R_{15}$ to $R_{18}$ independently represent an aromatic hydrocarbon group or aromatic heterocyclic group, which may contain a substituent and bind each other to form a cyclic structure. Y represents an arylene group which may contain a substituent.

In Formula 10, all of $R_{19}$ to $R_{24}$ independently represent hydrogen or a substituent selected from hydroxy, nitro, cyano, carboxy, amino, alkyl, alkenyl, cycloalkyl, alkoxy, aromatic hydrocarbon, aromatic heterocyclic, aralkyl, aryloxy, and alkoxycarbonyl groups, where the amino, alkyl, alkenyl, cycloalkyl, alkoxy, aromatic hydrocarbon, aromatic heterocyclic, aralkyl, aryloxy, and alkoxycarbonyl group may contain a substituent. $L_1$ represents alkyl, alkenyl, cycloalkyl, aromatic hydrocarbon, aromatic heterocyclic, or aralkyl group, where the alkyl, alkenyl, cycloalkyl, aromatic hydrocarbon, aromatic heterocyclic, or aralkyl group may contain a substituent. m represents an integer selected from 0 to 2, and n represents an integer selected from 1 to 3. M represents a metal ion with a valency of (n+m).

In Formula 11, all of $R_{25}$ to $R_{36}$ independently represent hydrogen or a substituent selected from halogens, hydroxy, nitro, cyano, carboxy, amino, alkyl, alkenyl, cycloalkyl, alkoxy, aromatic hydrocarbon, aromatic heterocyclic, aralkyl, aryloxy, and alkoxycarbonyl groups, where the amino, alkyl, alkenyl, cycloalkyl, alkoxy, aromatic hydrocarbon, aromatic heterocyclic, aralkyl, aryloxy, and alkoxycarbonyl groups may contain a substituent and bind each other to form a cyclic structure. $L_2$ represents alkylene, alkenylene, cycloalkylene, bivalent aromatic hydrocarbon, or bivalent aromatic heterocyclic group, where the alkylene, alkenylene, cycloalkylene, aromatic hydrocarbon, or aromatic heterocyclic group may contain a substituent. 1 represents an integer of 0 or 1 and s represents an integer of 1 or 2. M represents a metal ion with a valency of (s+1).

In Formula 12, all of $R_{37}$ to $R_{40}$ independently represent cyano, alkyl, alkenyl, cycloalkyl, alkoxy, aromatic hydrocarbon, aromatic heterocyclic, or aryloxy group, where the alkyl, alkenyl, cycloalkyl, alkoxy, aromatic hydrocarbon, aromatic heterocyclic, or aryloxy group may contain a substituent and bind each other to form a cyclic structure. Y represents an arylene group, which may contain a substituent.

In Formula 13, all of $R_{41}$ to $R_{46}$ independently represent an aromatic hydrocarbon group or aromatic heterocyclic group, which may contain one or more substituents or the substituents may bind each other to form a cyclic structure. Z represents a trivalent aromatic hydrocarbon group or trivalent aromatic heterocyclic group, which may contain one or more substituents.

Explaining the substituents in Formulae 8 to 13, the halogens can be fluoro, chloro, bromo, or iodo. A substituted or unsubstituted amino group is represented by —$NX_1X_2$, and $X_1$ and $X_2$ are each independently hydrogen, methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dicholoro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 4-styrylphenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl) phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridyl, 3-pyridyl, 4-pyridyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuryl, 3-benzofuryl, 4-benzofuryl, 5-benzofuryl, 6-benzofuryl, 7-benzofuryl, 1-isobenzofuryl, 3-isobenzofuryl, 4-isobenzofuryl, 5-isobenzofuryl, 6-isobenzofuryl, 7-isobenzofuryl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoqulnolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, or 4-t-butyl-3-indolyl group.

The substituted or unsubstituted alkyl group is a straight- or branched-chain alkyl group, which may contain one or more substituents such as methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dicholoro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitromethyl, 2-nitroisobutyl, 1,2-dinitroethyl, 1,3-dinitroisopropyl, 2,3-dinitro-t-butyl, and 1,2,3-trinitropropyl groups.

The substituted or unsubstituted alkenyl group is a straight- or branched-chain alkenyl group, which may contain one or more substituents such as vinyl, allyl, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, and 3-phenyl-1-butenyl groups.

The substituted or unsubstituted cycloalkyl group is a branched-chain cycloalkyl group, which may contain one or more substituents such as cyclopropyl, cyclobutyl, cyclopentyl, cyclohexyl, and 4-methylcyclohexyl groups.

The substituted or unsubstituted alkoxy group is represented by —OY, where Y is, for example, methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dicholoro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, or 1,2,3-trinitropropyl group.

The substituted or unsubstituted aromatic hydrocarbon group is a monovalent or multivalent aromatic hydrocarbon group, which may contain one or more substituents such as phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, and 4"-t-butyl-p-terphenyl-4-yl groups.

The substituted or unsubstituted aromatic heterocyclic group is a monovalent or multivalent group of monocyclic or polycyclic heterocyclic compound which may contain one or more heteroatoms such as nitrogen, oxygen, sulfur, and selenium, where the aromatic heterocyclic group may contain one or more substituents. Examples of such an aromatic heterocyclic group are 1-pyrroly, 2-pyrrolyl, 3-pyrrolyl, pyrazinyl, 2-pyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuryl, 3-benzofuryl, 4-benzofuryl, 5-benzofuryl, 6-benzofuryl, 7-benzofuryl, 1-isobenzofuryl, 3-isobenzofuryl, 4-isobenzofuryl, 5-isobenzofuryl, 6-isobenzofuryl, 7-isobenzofuryl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, or 4-t-butyl-3-indolyl group.

Examples of the substituted or unsubstituted aralkyl group are benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphtylmethyl, 1-α-naphtylethyl, 2-β-naphtylethyl, 1-β-naphtylisopropyl, 2-β-naphtylisopropyl, 1-pyrrolylmethyl, 2-(1-pyrrolyl)ethyl, p-methylbenzyl, m-methylbenzyl, o-methylbenzyl, p-chlorobenzyl, m-chrolobenzyl, o-chrolobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-amiriobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chrolo-2-phenylisopropyl groups.

The substituted or unsubstituted aryloxy group is represented by —OZ, where Z is, for example, phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridyl, 3-pyridyl, 4-pyridyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuryl, 3-benzofuryl, 4-benzofuryl, 5-benzofuryl, 6-benzofuryl, 7-benzofuryl, 1-isobenzofuryl, 3-isobenzofuryl, 4-isobenzofuryl, 5-isobenzofuryl, 6-isobenzofuryl, 7-isobenzofuryl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-1-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, or 4-t-butyl-3-indolyl group.

The substituted or unsubstituted alkoxy carbonyl group is represented by —COOY, where Y is, for example, methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dicholoro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, or 1,2,3-trinitropropylb group.

The substituted or unsubstituted allylene group is, for example, an aromatic hydrocarbon or condensed polycyclic hydrocarbon such as a substituted or unsubstituted benzen, naphthalene, anthracene, phenanthrene, naphthacene, pyrene, biphenyl or terphenyl; or a divalent group of heterocyclic or condensed hetarocyclic compounds such as a substituted or unsubstituted carbazole, pyrrole, thiophene, furan, imidazole, pyrazole, isothiazole, isooxazole, pyridine, pyrazine, pyrimidine, pyridazine, furazane, thianthrene, isobenzofuran, phenoxazine, indolizine, indole, isoindole, 1H-indazole, purine, quinoline, isoquinoline, phthalazine, naphthyridine, quinoxaline, quinazoline, cinnoline, pteridine, carbazole, β-carbazoline, phenanthridine, acridine, perimidine, phenanthroline, phenazine, phenothiazine, or phenoxazine.

The trivalent substituted or unsubstituted aromatic hydrocarbon is a trivalent group of aromatic hydrocarbon or condensed polycyclic hydrocarbon such as a substituted or unsubstituted benzene, naphthalene, anthracene, phenanthrene, naphthacene, pyrene, biphenyl or terphenyl. The trivalent substituted or unsubstituted aromatic heterocyclic group is a trivalent group of heterocyclic or condensed heterocyclic compound such as a substituted or unsubstituted unsubstituted carbazole, pyrrole, thiophene, furan, imidazole, pyrazole, isothiazole, isooxazole, pyridine, pyrazine, pyrimidine, pyridazine, furazane, thianthrene, isobenzofuran, phenoxazine, indolizine, indole, isoindole, 1H-indazole, purine, quinoline, isoquinoline, phthalazine, naphthyridine, quinoxaline, quinazoline, cinnoline, pteridine, carbazole, β-carbazoline, phenanthridine, acridine, perimidine, phenanthroline, phenazine, phenothiazine, or phenoxazine.

The substituted or unsubstituted alkylene group is, for example, a bivalent group of alkane, which may contain one or more substituents, such as a methane, ethane, propane, n-butane, 2-methylpropan, n-pentane, 2-methylbutane, 2,2-dimethylpropane, n-hexane, 2-methyl-n-pentane, 3-methyl-n-pentane, 2,2-dimethylbutane, or 2,3-dimethylbutane. The substituted or unsubstituted alkenylene group is, for example, a bivalent group of alkane, which may contain one or more substituents, such as an ethylene, propylene, 1-butene, 2-butene, or 1,3-butadiene. The substituted or unsubstituted cycloalkylene is, for example, a bivalent group of cycloalkane, which may contain one or more substituents, such as a cyclopropane, cyclobutane, cyclopentane, or cyclohexane.

Examples of the substitutes, which these multivalent groups have, are halogens, hydroxy, substituted or unsubstituted amino, nitro, cyano, substituted or unsubstituted alkyl, substituted or unsubstituted alkenyl, substituted or unsubstituted cycloalkyl, substituted or unsubstituted alkoxy, substituted or unsubstituted aromatic hydrocarbon, substituted or unsubstituted aromatic heterocyclic, substituted or unsubstituted aralkyl, substituted or unsubstituted aryloxy, substituted or unsubstituted alkoxycarbonyl, and carboxy groups. Examples of the bivalent groups, which form a cyclic structure, are tetramethylene, pentamethylene, hexamethylene, diphenylmethane-2,2'-diyl, diphenylmethane-3,3'-diyl, diphenylmethane-4,4'-diyl, and 1,3-butadienyl-1,4-en groups. Metals, which form oxime metal complexes are, for example, aluminum, beryllium, bismuth, cadmium, cerium, cobalt, copper, iron, gallium, germanium, mercury, indium, lanthanum, magnesium, molybdenum, niobium, antimony, scandium, tin, tantalum, thorium, titanium, uranium, tungsten, zirconium, vanadium and zinc. Such host luminescent agents are, for example, the compounds represented by Formulae

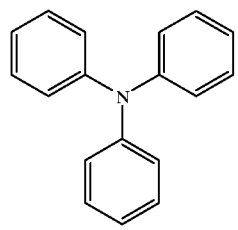

Chemical Formula 62

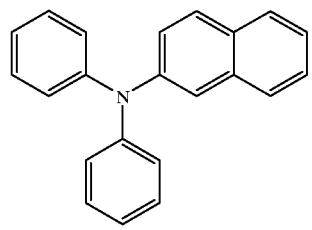

Chemical Formula 63

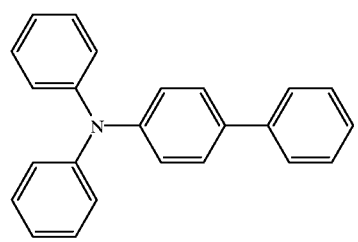

Chemical Formula 64

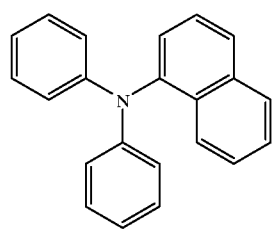

Chemical Formula 65

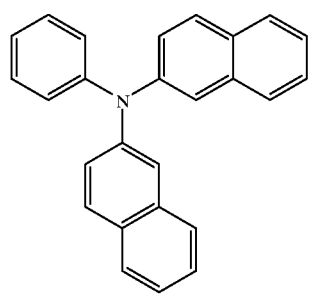

Chemical Formula 66

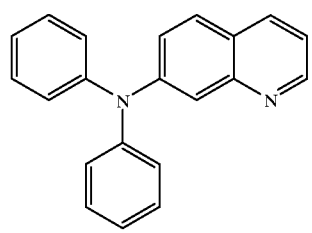

Chemical Formula 67

-continued
Chemical Formula 68
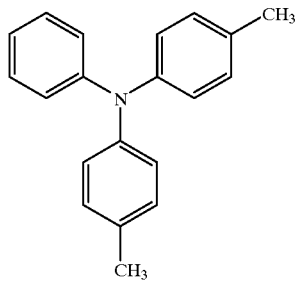
Chemical Formula 69
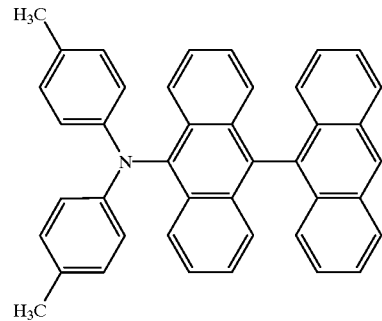
Chemical Formula 70
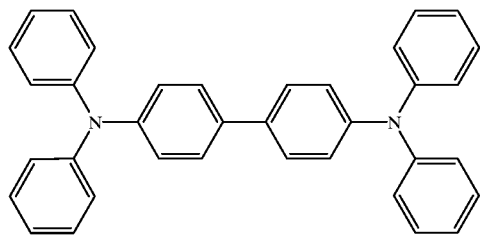
Chemical Formula 71
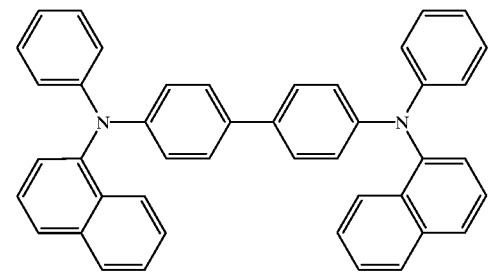
Chemical Formula 72
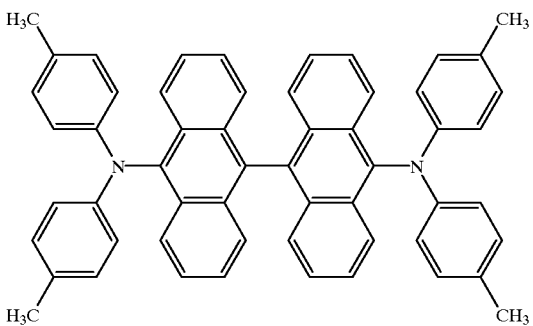
Chemical Formula 73
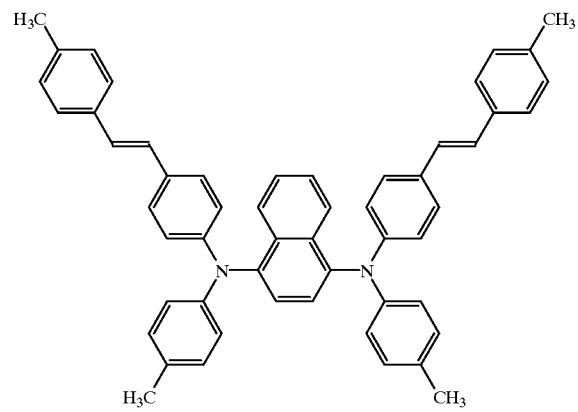
Chemical Formula 74
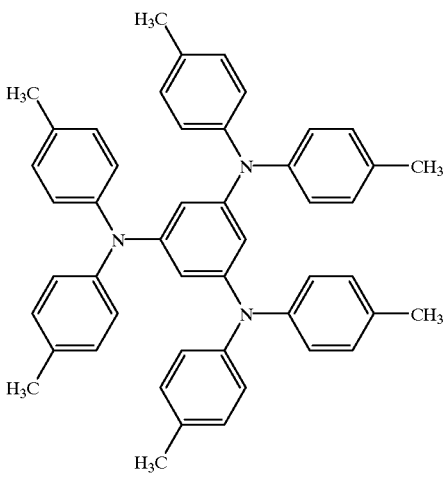
Chemical Formula 75
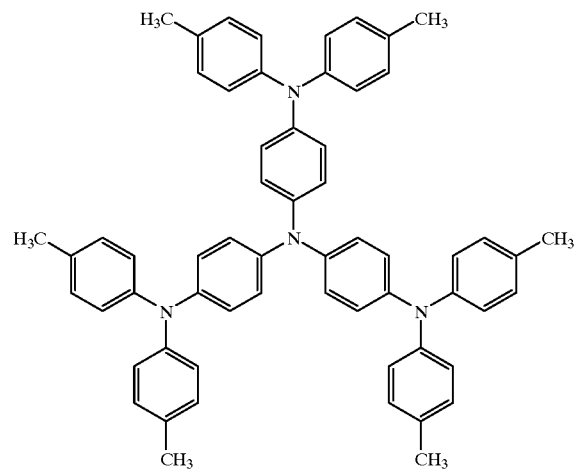

-continued
Chemical Formula 76
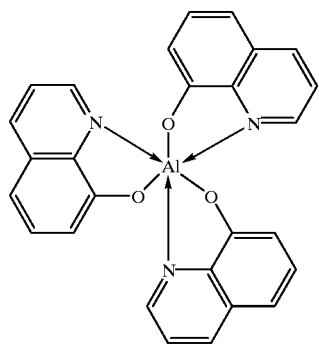
Chemical Formula 77
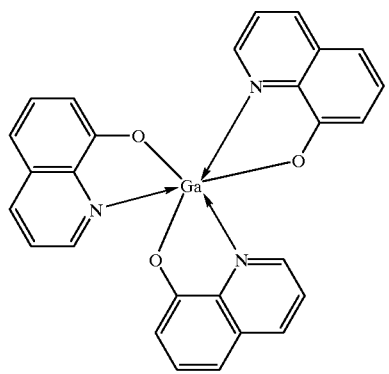
Chemical Formula 78
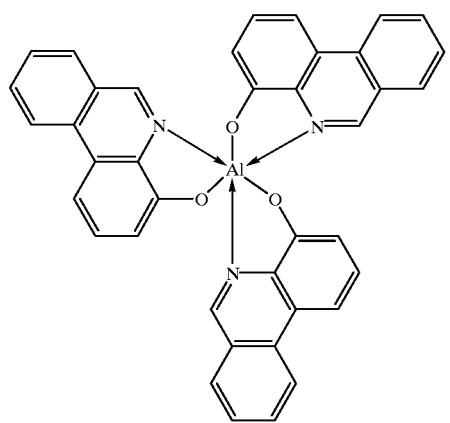
Chemical Formula 79
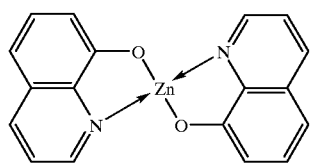
Chemical Formula 80
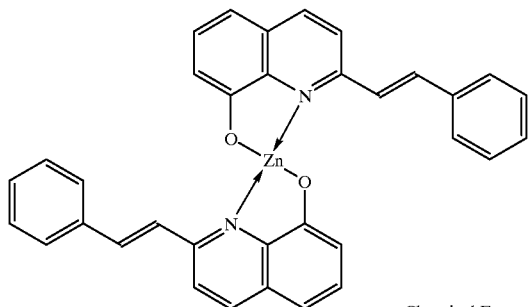
Chemical Formula 81
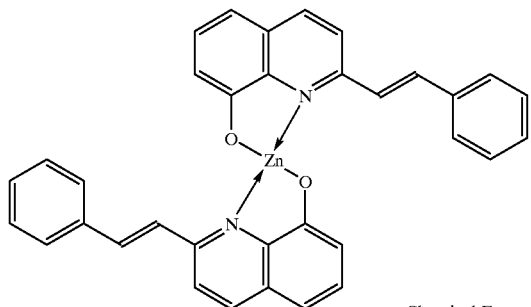
Chemical Formula 82
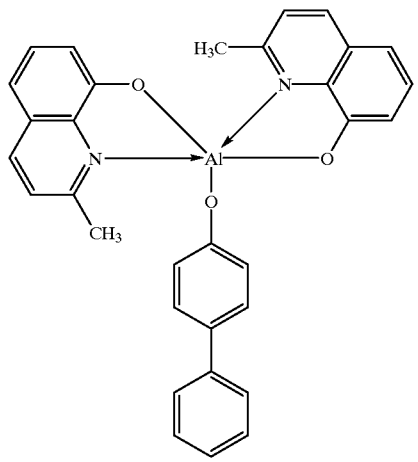
Chemical Formula 83
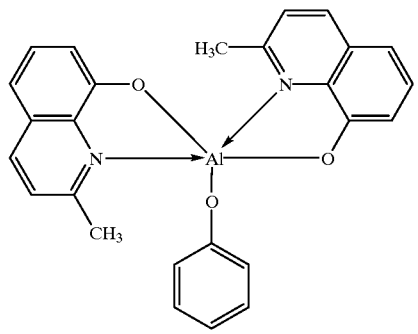

Chemical Formula 84
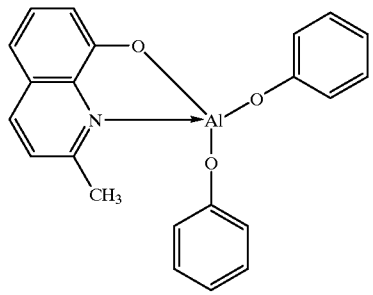
Chemical Formula 85
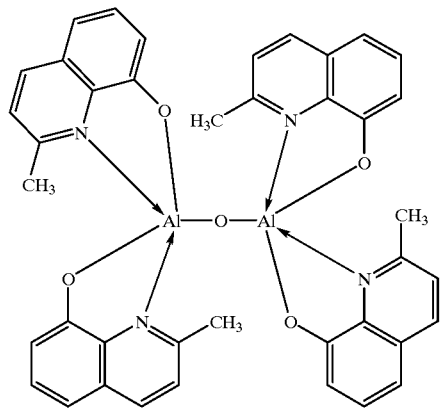
Chemical Formula 86
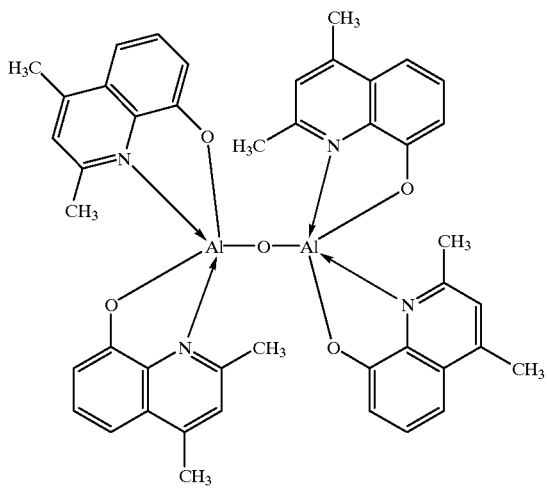
Chemical Formula 87
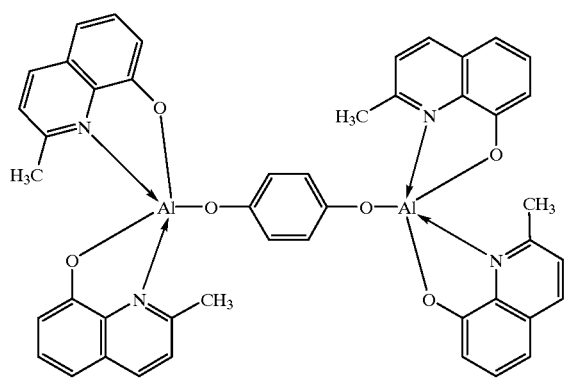
Chemical Formula 88
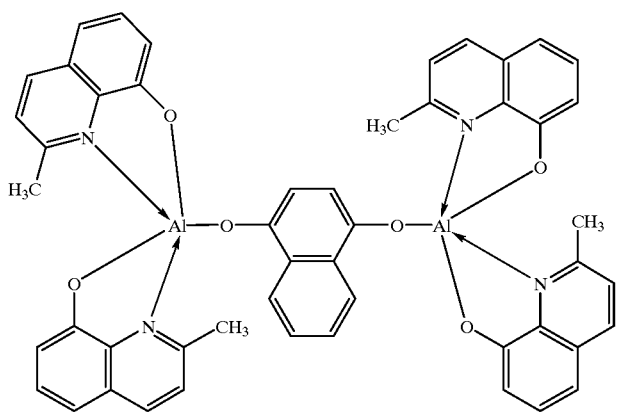

Chemical Formula 89

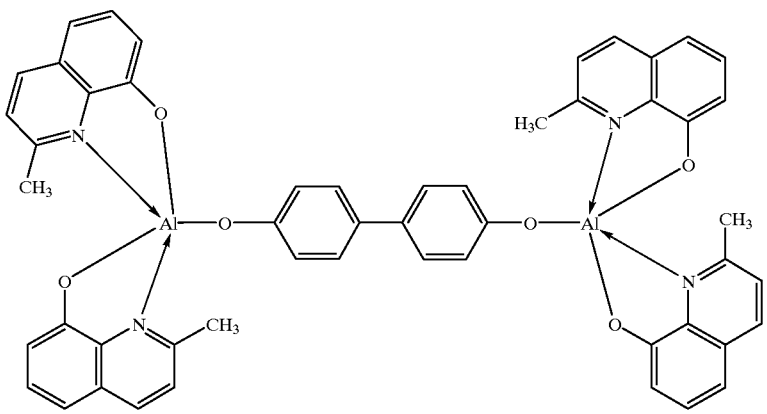

Chemical Formula 90

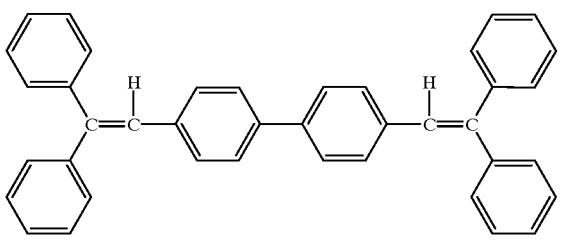

Chemical Formula 91

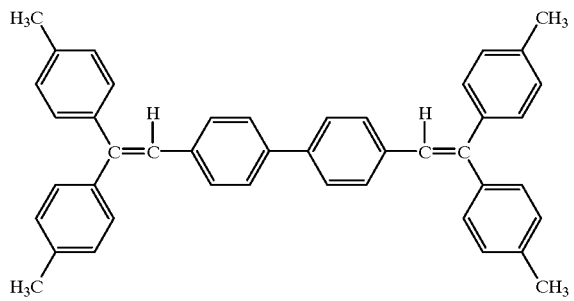

Chemical Formula 92

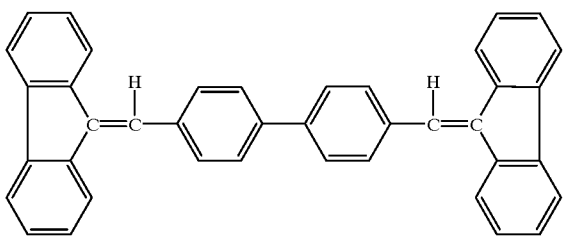

The reference numeral 5 represents an electron injection/transportation layer which is formed by attaching closely to luminous layer 4 by the same methods as used in anode 2, and then forming a layer having a thickness of 10–500 nm with one or more organic compounds which have a high electron affinity and do not absorb light in a red region, for example, the same compounds as used in luminous layer 4, cyclic ketones such as benzoquinone, anthraquinone, freorenon, or derivatives thereof; silazane derivatives; and conductive oligomers or polymers which have aniline, thiophen, or pyrrole as a repeating unit. In the case of using different materials for electron injection/transportation layers, the materials may be uniformly mixed to form a monolayer or, without mixing, may be separately formed into layers of alternatingly-arranged electroninjection/transportation layers. Examples of respective materials for electron injection/transportation layers are the compounds of Formulae 76, 78, 80, 81, and 93–96.

Chemical Formula 76
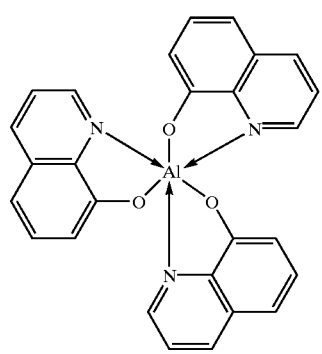
Chemical Formula 78
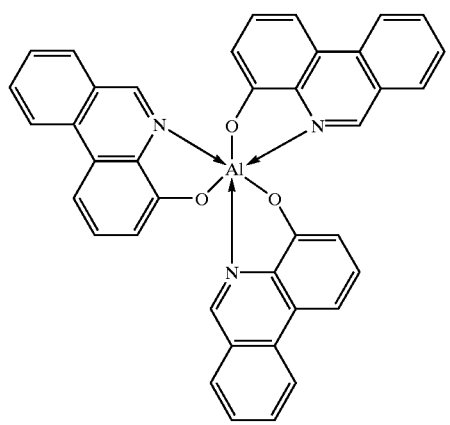
Chemical Formula 80
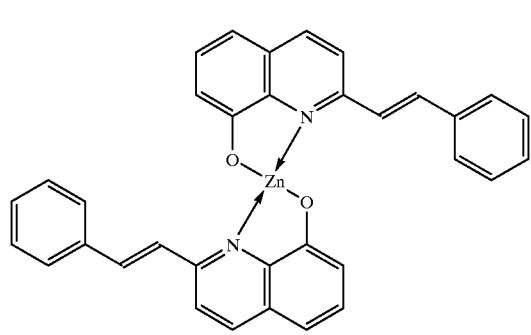
Chemical Formula 81
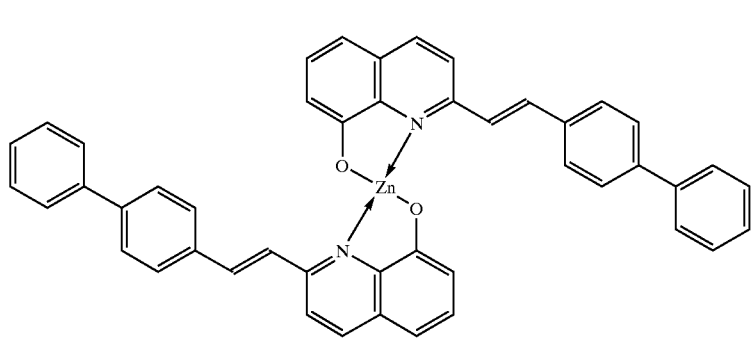
Chemical Formula 93
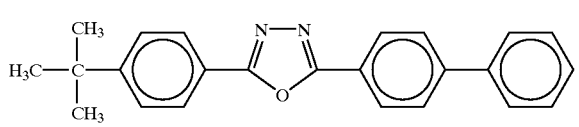
Chemical Formula 94
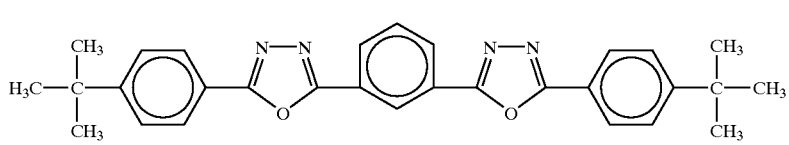

Chemical Formula 95

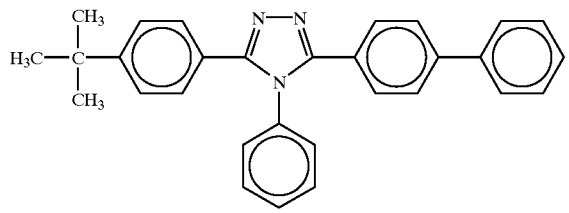

Chemical Formula 96

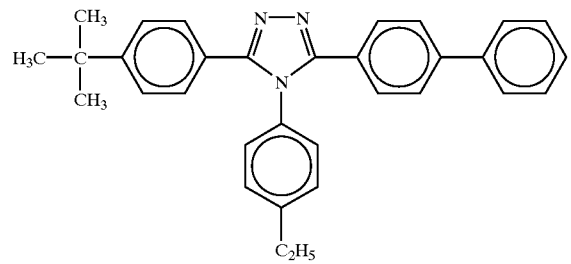

The reference numeral 6 represents a cathode which is usually formed by attaching closely to the electron injection/transportation layer 5 and then evaporating thereunto metals such as lithium, magnesium, calcium, sodium, lithium, silver, copper, aluminum, indium, or scandium having a lower work-function usually of, not higher than 6 eV, which is lower than that of the compound used in the electron injection/transportation layer 5; a metal oxide or conductive compound, independently or in combination. The thickness of cathode 6 is not specifically restricted and is set to 10 nm or more, desirably, 50–500 nm, to give a resistively of 1 kΩ/□ or lower, in view of electric conductivity, production cost, thickness of devices, and light transmittance. An interface layer, which comprises a compound such as aromatic diamine, quinacridone, naphthacene, organic silicon, or organic phosphide, can be formed to improve the close adhesion between cathode 3 and the electron injection/transportation layer 5, if necessary.

Thus, the organic EL devices of the present invention can be obtained by forming on substrate 1 uniform layers of anode 2, cathode 6, and luminous layer 4, and optionally, hole injection/transportation layer 3 and electron injection/transportation layer 5 in this order while the adjacent layers are attached together. In forming each layer, it is desirable to consistently operate under a relatively-high vacuum conditions, particularly, $10^{-5}$ Torr or lower, to suppress the oxidation and decomposition of organic compounds and the adhesion of oxygen and water. To form a luminous layer, the ratio of a host luminous agent and the pyran derivative of the present invention can be regulated by premixing them in a prescribed ratio, or separately controlling their heating velocity in their vacuum evaporation. To suppress the deterioration under use conditions, the organic EL devices thus obtained can be preferably treated in such a manner that a part or the whole of the devices is sealed with a sealing glass or metallic cap under atmosphere of inactivated gas, or covered with a protection layer such as an ultraviolet-hardened resin.

Explaining the use of the organic EL devices of the present invention, they are driven by intermittently energizing a pulse voltage with a relatively-high voltage, or continuously energizing a non-pulse voltage with a relatively-constant voltage, usually, 3–50 V, dependently on uses. The organic EL devices of the present invention emit light only when the potential of anode exceeds the one of cathode. Thus, the voltage for energizing the organic EL devices of the present invention can be both a direct and alternating currents, and the wave form and the cycle of energizing voltages can be appropriately selected. When energized with an alternating current, the organic EL devices of the present invention alternatively increase and decrease their brightness, or repeatedly turn on and off. In the case of the organic device as shown in FIG. 2, when a voltage is energized between anode 2 and cathode 6, holes injected from anode 2 come into luminous layer 4 through hole injection/transportation layer 3, and electrons injected from cathode 6 come into luminous layer 4 through electron injection/transportation layer 5, respectively. As a result, the holes and electrons rebind in luminous layer 4, then the desired red light is emitted from pyran derivatives in an excited state, generated by the emission through anode 2 and substrate 1. Depending on the kinds of host luminescent agents and the pyran derivatives used in combination, the organic EL devices of the present invention usually have luminous maxima in a red region with wavelengths of 600–670 nm, desirably, 620–660 nm. On an xy-color-degree-table, x of the luminescence is usually in the range of 0.50–0.72 and Y of the luminescence is in the range of 0.20–0.36.

Since the organic EL devices of the present invention have a good color purity of luminescence in a red region and an excellent emission efficiency and durability, they have various uses in luminous bodies and information displaying devices for displaying information visually. Since luminous bodies, which have the organic EL devices of the present invention as a source of light, have a relatively-small consumptive electric power and can be formed into light weight- and flat-boards, they are useful as low-energy and compact-space lighting sources for liquid crystal devices, duplicating machines, inkers, electronic photography machines, computers and the applied machines, industrial controllers, electronic measuring instruments, analyzers, general meters, communications apparatuses, electronic measuring instruments for medical treatment; machines carried on a car, ship, airplane and spaceship; controllers of airplane, interior, signboard, and mark. When used the organic EL devices of the present invention in information displaying devices such as computers, televisions, videos, games, clocks, telephones, car navigations, oscilloscopes, radars, and sonars, they can be driven singly or in combination with organic EL devices, which emit light in a green or blue region, by applying a conventional simple matrix method or active matrix method, if necessary.

When used in dye lasers, the pyran derivatives of the present invention is enclosed in dye cells of laser oscillating machines after purified similarly as in dye-laser active substances, then dissolved in appropriate solvents, and if necessary, followed by adjusting the resulting solutions to an appropriate pH level. As compared with conventional pyran derivatives, the pyran derivatives of the present invention have characteristics that they attain a satisfactory stage gain over a relatively-wide range of wavelengths in visible region, have a relatively-high light-resistance, and do not substantially deteriorate even when used for a relatively-long period of time.

The preferred embodiments according to the present invention are described hereinafter with reference to the following Examples:

EXAMPLE 1

Pyran Derivative 1.0 g of the compound represented by chemical Formula 97 with a 4-dicyanomethylene-2-methyl-4H-pyran skeleton and 1.0 g of the compound represented by Chemical Formula 98 with a 3-formyl coumarin skeleton were dissolved in five milliliters of N,N-dimethylformamide. The solution was admixed with 0.5 ml piperidine, and the mixture was refluxed for two hours, then cooled to ambient temperature and filtered to collect the formed crystal. The crystal was recrystallized in N,N-dimethylformamide to obtain 0.7 g of a black crystal of the pyran derivative, represented by Chemical Formula 2.

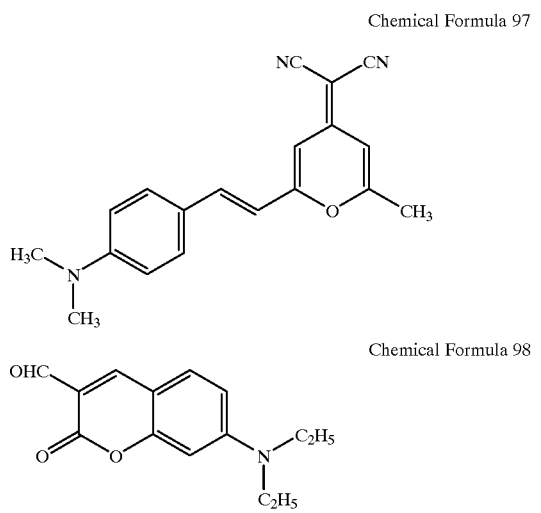

Chemical Formula 97

Chemical Formula 98

Conventional measurement revealed that the pyran derivative had a melting point of 288–290° C. and exhibited an absorption- and fluorescent-maxima at wavelengths of 491 nm and 626 nm, respectively, when measured in methylene chloride. Upon measurement of $^1$H-nuclear magnetic resonance spectrum (hereinafter abbreviated as "$^1$H-NMR") in chloroform deuteride, the compound showed peaks at chemical shift δ (ppm, TMS) of 1.24 (6H, t), 3.06 (6H, s), 3.45 (4H, q), and 6.3–7.7 (14H, m).

EXAMPLE 2

Pyran Derivative 1.2 g of the compound represented by Chemical Formula 97 with a 4-dicyanomethylene-2-methyl-4H-pyran skeleton and 2.0 g of the compound represented by Chemical Formula 99 with a 3-formyl coumarin skeleton were dissolved in five milliliters of N,N-dimethylformamide. The solution was admixed with 0.5 ml piperidine, and the mixture was refluxed for two hours, then cooled to ambient temperature and filtered to collect the formed crystal. The crystal was recrystallized in N,N-dimethylformamide to obtain 0.8 g of a black crystal of the pyran derivative, represented by Chemical Formula 5.

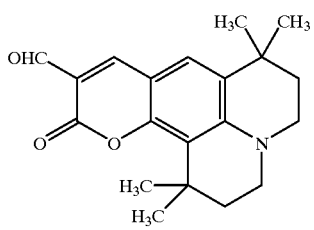

Chemical Formula 99

Conventional measurement revealed that the pyran derivative had a melting point of 280–282° C. and exhibited an absorption- and fluorescent-maxima at wavelengths of 503 nm and 656 nm, respectively, when measured in methylene chloride. Upon measurement of $^1$H-NMR in chloroform deuteride, the compound showed peaks at chemical shift δ (ppm, TMS) of 1.32 (6H, s), 1.57 (6H, s), 1.80 (4H, m), 3.06 (6H, s), 3.34 (4H, m), and 6.4–7.7 (12H, m).

EXAMPLE 3

Pyran Derivative 0.8 g of the compound represented by Chemical Formula 100 with a 4-dicyanomethylene-2-methyl-4H-pyran skeleton and 1.1 g of the compound represented by Chemical Formula 99 with a 3-formyl coumarin skeleton were dissolved in five milliliters of N,N-dimethylformamide. The solution was admixed with 0.5 ml piperidine, and the mixture was refluxed for two hours, then cooled to ambient temperature and filtered to collect the formed crystal. The crystal was recrystallized in N,N-dimethylformamide to obtain 0.4 g of a red-black crystal of the pyran derivative, represented by Chemical Formula 17.

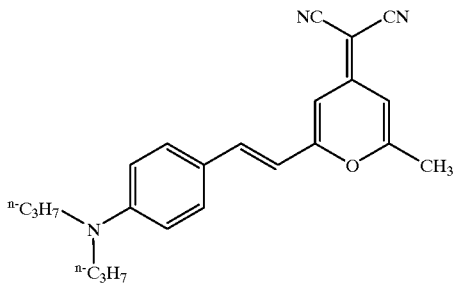

Chemical Formula 100

Conventional measurement revealed that the pyran derivative had a melting point of 195–197° C. and exhibited an absorption- and fluorescent-maxima at wavelengths of 509 nm and 662 nm, respectively, when measured in methylene chloride. Upon measurement of $^1$H-NMR in chloroform deuteride, the compound showed peaks at chemical shift δ (ppm, TMS) of 0.96 (6H, t), 1.32 (6H, s), 1.58 (6H, s), 1.80 (8H, m), 2.90 (4H, m), 3.4 (4H, m), and 6.3–7.7 (12H, m).

EXAMPLE 4

Pyran Derivative 0.8 g of the compound represented by Chemical Formula 101 with a 4-dicyanomethylene-2-methyl-4H-pyran skeleton and 1.2 g of the compound represented by Chemical Formula 98 with a 3-formyl coumarin skeleton were dissolved in seven milliliters of N,N-dimethylformamide. The solution was admixed with 0.7 ml piperidine, and the mixture was refluxed for two hours, then cooled to ambient temperature and filtered to collect the formed crystal. The crystal was recrystallized in N,N-dimethylformamide to obtain 1.0 g of a black crystal of the pyran derivative, represented by Chemical Formula 36.

Chemical Formula 101

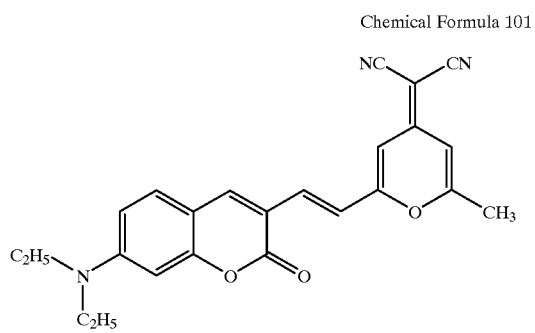

Conventional measurement revealed that the pyran derivative had a melting point of 329–331° C. and exhibited an absorption- and fluorescent-maxima at wavelengths of 500 nm and 618 nm, respectively, when measured in methylene chloride. Upon measurement of $^1$H-NMR in chloroform deuteride, the compound showed peaks at chemical shift δ (ppm, TMS) of 1.24 (12H, t), 3.45 (8H, q), and 6.5–7.7 (14H, m).

EXAMPLE 5

Pyran Derivative 1.0 g of the compound represented by Chemical Formula 102 with a 4-dicyanomethylene-2-methyl-4H-pyran skeleton and 1.3 g of the compound represented by Chemical Formula 99 with a 3-formyl coumar-n skeleton were dissolved in four milliliters of N,N-dimethylformamide. The solution was admixed with 0.4 ml piperidine, and the mixture was refluxed for two hours, then cooled to ambient temperature. 0.7 g of the formed crystal was filtered to collect and recrystallized in N,N-dimethylformamide to obtain 0.5 g of a black crystal of the pyran derivative, represented by Chemical Formula 24.

Chemical Formula 102

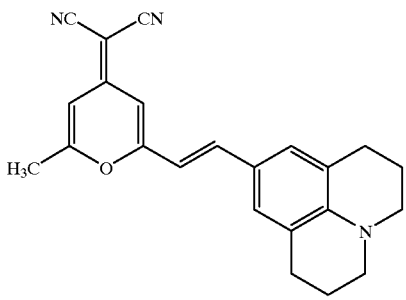

Conventional measurement revealed that the pyran derivative had a melting point of 263–266° C. and exhibited an absorption- and fluorescent-maxima at wavelengths of 519 nm and 677 nm, respectively, when measured in methylene chloride. Upon measurement of $^1$H-NMR in chloroform deuteride, the compound showed peaks at chemical shift δ (ppm, TMS) of 1.32 (6H, s), 1.54 (6H, s), 1.7–2.0 (8H, m), 2.8 (4H, m), 3.3 (8H, m), and 6.5–7.7 (10H, m).

EXAMPLE 6

Pyran Derivative 0.6 g of the compound represented by Chemical Formula 103 with a 4-dicyanomethylene-2-methyl-4H-pyran skeleton and 0.5 g of the compound represented by Chemical Formula 99 with a 3-formyl coumarin skeleton were dissolved in three milliliters of N,N-dimethylformamide. The solution was admixed with 0.2 ml piperidine, and the mixture was refluxed for two hours, then cooled to ambient temperature. 1.2 g of the formed crystal was filtered to collect and recrystallized in N,N-dimethylformamide to obtain 1.0 g of a black-green crystal of the pyran derivative, represented by Chemical Formula 53.

Chemical Formula 103

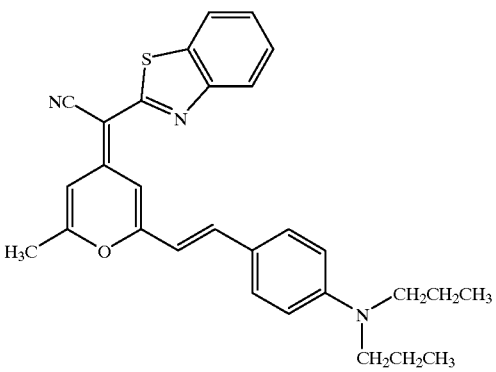

Conventional measurement revealed that the pyran derivative had a melting point of 177–180° C. and exhibited an absorption- and fluorescent-maxima at wavelengths of 534 nm and 679 nm, respectively, when measured in methylene chloride. Upon measurement of $^1$H-NMR in chloroform deuterlde, the compound showed peaks at chemical shift δ (ppm, TMS) of 0.69 (6H, t), 1.32 (6H, s), 1.6 (10H, m), 1.7–1.8 (4H, m), 3.3–3.5 (8H, m), and 6.5–8.5 (16H, m).

EXAMPLE 7

Pyran Derivative 1.0 g of the compound represented by Chemical Formula 104 with a 4-dicyanomethylene-2-methyl-4H-pyran skeleton and 0.9 g of the compound represented by Chemical Formula 99 with a 3-formyl coumarin skeleton were dissolved in five milliliters of N,N-dimethylformamide. The solution was admixed with 0.3 ml piperidine, and the mixture was refluxed for one hour, then cooled to ambient temperature. 1.6 g of the formed crystal was filtered to collect and recrystallized in N,N-dimethylformamide to obtain 1.4 g of a green-black crystal of the pyran derivative, represented by Chemical Formula 54.

Chemical Formula 104

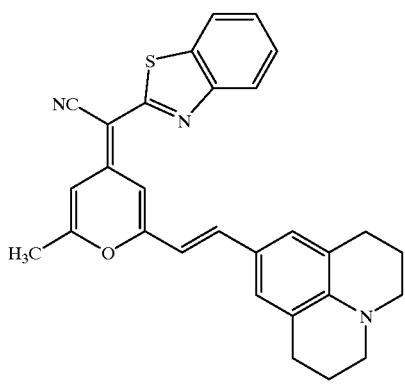

Conventional measurement revealed that the pyran derivative had a melting point of 249–252° C. and exhibited an absorption- and fluorescent-maxima at wavelengths of 534 nm and 725 nm, respectively, when measured in methylene chloride. Upon measurement of $^1$H-NMR in chloroform deuteride, the compound showed peaks at chemical shift δ (ppm, TMS) of 1.32 (6H, s), 1.54 (6H, s), 1.7–2.0 (8H, m), 2.8 (4H, m), 3.3 (8H, m), and 6.3–7.7 (14H, m).

The properties of the pyran derivatives in Examples 1 to 7 are tabulated in Table 1. In Table 1, the wavelengths of absorption maxima were measured after dissolving the pyran derivatives in methylene chloride, and their fluorescent spectra were measured in methylene chloride at a concentration of $10^{-7}$M. As a control, a conventional pyran derivative, represented by Chemical Formula 97, was used.

TABLE 1

| Compound | Maximum absorption wavelength (nm) | Fluorescence Maximum wavelength (nm) | Fluorescence Relative intensity | Melting point (° C.) | Remarks |
|---|---|---|---|---|---|
| Formula 2 | 491 | 626 | 0.3 | 288–290 | Present invention |
| Formula 5 | 503 | 656 | 3.0 | 280–282 | Present invention |
| Formula 17 | 509 | 662 | 1.4 | 195–197 | Present invention |
| Formula 24 | 519 | 677 | 3.1 | 263–266 | Present invention |
| Formula 54 | 534 | 725 | 2.2 | 249–252 | Present invention |
| Formula 53 | 534 | 679 | 0.9 | 177–180 | Present invention |
| Formula 36 | 500 | 618 | 4.9 | 329–331 | Present invention |
| Formula 97 | 468 | 589 | 1.8 | 215–217 | Control |

As evident from the results in Table 1, the absorption maxima of the pyran derivatives of the present invention clearly shifted to the side of a longer wavelength as compared with the control, and were close to the oscillating wavelength of argon ion laser and the second harmonic wavelength of YAG laser. Then, the wavelength of absorption maximum of the pyran derivative, represented by Chemical Formula 2, was close to the oscillating wavelength of 488 nm by argon ion laser; and those of the pyran derivatives, represented by Chemical Formulae 5, 17, 24, 36, 53 and 54, were close to that of the second harmonic wavelength of 532 nm by YAG laser. This demonstrates that the pyran derivatives of the present invention are useful as photosensitizers which polymerize polymerizable compounds with visible light. As far as the fluorescent measurement under the above conditions, fluorescence of the pyran derivatives represented by Chemical Formula 2 was negligible, however, the other pyran derivatives in Table 1 had remarkable luminous abilities and showed equal or significantly-stronger luminescence as compared with those of control. This indicates that the pyran derivatives of the present invention are useful as laser-active substances in dye lasers and luminescent agents in organic EL devices. Although materials and reaction conditions are varied in some degrees dependently on the structures of the pyran derivatives of the present invention, all of the pyran derivatives of the present invention, including the compounds represented by Chemical Formulae 1 to 55, can be easily produced by the methods in Examples 1 and 7 and in accordance therewith.

EXAMPLE 8

Photopolymerizable Composition

According to a usual manner, four types of photopolymerizable compositions were prepared by mixing 900 parts by weight of ethyl cellosolve with 100 parts by weight of pentaerythritol acrylate as a photopolymerizable compound, 100 parts by weight of acrylic acid/methacrylic acid copolymer as a binder, eight parts by weight of 3,3',4,4'-tetra(t-butylperoxycarbonyl)benzophenone as a polymerization initiator, and two parts by weight of any one of pyran derivatives, represented by Chemical Formulae 2, 5, 17 and 36, as a photosensitizer, obtained by the methods in Examples 1 to 4.

According to a usual manner, the photopolymerizable compositions thus obtained were homogeneously coated over sand-set aluminum plates, which the surfaces had been treated, to form photosensitive layers, followed by forming polyvinyl alcohol layers thereupon to protect the polymerization inhibition by oxygen. A grace scale was closely attached to either of the photosensitive layers and, after installing a 150 W xenon lump, was irradiated by the lamp with a light of 488 nm, corresponding to the light of argon ion laser, and a light of 532 nm, corresponding to the light of the second harmonic by YAG laser, which were both obtained by combining sharp cut filters ("Y47"and "Y52") commercialized by Toshiba Glass Kabushiki Kaisha, Tokyo, Japan; interference filters ("KL49" and "KL54") commercialized by Toshiba Glass Kabushiki Kaisha, Tokyo, Japan; and a heat-ray-cut-filter ("HA30") commercialized by HOYA Corporation, Tokyo, Japan. Thereafter, the irradiated layers were in a usual manner developed in an alkaline developer, followed by calculating the sensitivity based on the step number at which the compositions were photo-cured in such a manner that, in the numerical formula represented by the following equation, transmittance Tn of the step number "n" of a step tablet, exposure time t, and exposure strength Io were respectively substituted for the equation. Equation:

$$E(mJ/cm^2) = Io(mJ/cm^2\ s) \times Tn \times t(s)$$

In parallel, in place of the pyran derivatives of the present invention, a control system using a conventional compound, represented by Chemical Formula 104, was provided and treated similarly as above. The results are in Table 2.

TABLE 2

| Compound | Measurement at wavelength(nm) | Sensitivity (mJ/cm$^2$) | Remarks |
|---|---|---|---|
| Formula 2 | 488 | 0.7 | Present invention |
| Formula 5 | 488 | 0.6 | Present invention |
| Formula 17 | 488 | 0.8 | Present invention |
| Formula 36 | 488 | 0.9 | Present invention |
| Formula 97 | 488 | 1.4 | Control |
| Formula 2 | 532 | 1.5 | Present invention |
| Formula 5 | 532 | 1.3 | Present invention |
| Formula 17 | 532 | 0.9 | Present invention |
| Formula 36 | 532 | 1.4 | Present invention |
| Formula 97 | 532 | 2.8 | Control |

As evident from the results in Table 2, the pyran derivatives of the present invention, represented by Chemical Formulae 2, 5, 17 and 36, showed a higher sensitivity than that of the conventional pyran derivative represented by Chemical Formula 97, when measured at the wavelengths of 488 nm and 532 nm. Particularly, the pyran derivatives of the present invention, represented by Chemical Formulae 2 and 5, had an about two-fold higher sensitivity than that of the conventional pyran derivative represented by Chemical Formula 97, when measured at the wavelength of 488 nm. The pyran derivatives of the present invention, represented by Chemical Formulae 2 and 17, had an about two-fold higher sensitivity than that of the conventional pyran derivative represented by Chemical Formula 97, when measured at the wavelength of 532 nm. The data demonstrate that the pyran derivatives of the present invention are useful to sensitize polymerizable compounds and polymerization initiators in photochemical polymerization.

EXAMPLE 9

High-purity Pyran Derivatives

The pyran derivatives of the present invention, obtained by the methods in Examples 1 to 7, are in a conventional manner purified by sublimination to obtain seven types of high-purity pyran derivatives represented by Chemical Formulae 2, 5, 17, 24, 36, 53, and 54.

The pyran derivatives of this Example are very useful as laser action substances in dye lasers and luminous agents in organic EL devices.

EXAMPLE 10

Organic EL Device

As shown in FIG. 2, using the pyran derivative of the present invention represented by Chemical Formula 2 as a luminous agent, organic EL devices were prepared by sequentially laying anode 2, hole injection/transportation layer 3, luminous layer 4, electron injection/transportation layer 5, and cathode 6 in this order. Namely, ITO was spattered on glass substrate 1 to form a membrane as anode 2, having the sheet resistance of 20 Ω/□. Anode 2 was evaporated under vacuum conditions with N,N'-diphenyl-N, N'-bis(3-methylphenyl)-[1,1'-biphenyl]-4,4'-diamine represented by Chemical Formula 57 to form a layer, 40 nm in thickness, as hole injection/transportation layer 3, which was closely attached to anode 2; and the compounds represented by Chemical Formulae 76 and 2 were co-evaporated on hole injection/transportation layer 3 in a weight ratio of 49:1 to form a layer, 50 nm in thickness, as luminous layer 4, which was closely attached to hole injection/transportation layer 3. Further luminous layer 4 was evaporated under vacuum conditions with a compound represented by Chemical Formula 76 to form a layer, 20 nm in thickness, as electron injection/transportation layer 5, which was closely attached to luminous layer 4. Thereafter, on electron injection/transportation layer 5 were co-evaporated magnesium and silver to form a layer, 150 nm in thickness, in an evaporation weight ratio of 10:1, as a cathode, which was closely attached to electron injection/transportation layer 5. When a dc current voltage of eight volts was charged between anode 2 and cathode 6 thus obtained, it was emitted a red luminescence having a brightness of 492 cd/m$^2$ and a luminescent maximum at around a wavelength of 610 nm.

EXAMPLE 11

Organic EL Device

An organic EL device was prepared similarly as in Example 10 except for, in the preparation of luminous layer 4 in Example 10, replacing the pyran derivative represented by Chemical Formula 2 with the one represented by Chemical Formula 5. When a dc current voltage of eight volts was charged between the anode and the cathode of the organic EL device thus obtained, it was emitted a red luminescence having a brightness of 719 cd/m$^2$ and a luminescent maximum around a wavelength of 620 nm.

EXAMPLE 12

Organic EL Device

An organic EL device was prepared similarly as in Example 10 except for, in the preparation of luminous layer 4 in Example 10, replacing the pyran derivative represented by Chemical Formula 26 with the one represented by Chemical Formula 2. When a dc current voltage of eight volts was charged between the anode and the cathode of the organic EL device thus obtained, it was emitted a red luminescence which had a brightness of 848 cd/m$^2$ and a luminescent maximum around a wavelength of 623 nm.

EXAMPLE 13

Organic EL Device

An organic EL device was prepared similarly as in Example 10 except for, in the preparation of luminous layer 4 in Example 10, replacing the pyran derivative represented by Chemical Formula 36 with the one represented by Chemical Formula 2. When a dc current voltage of eight volts was charged between the anode and the cathode of the organic EL device thus obtained, it was emitted a red luminescence having a brightness of 885 cd/m$^2$.

EXAMPLE 14

Organic EL Device

An organic EL device was prepared similarly as in Example 10 except for, in the preparation of luminous layer 4 in Example 10, replacing the pyran derivative represented by Chemical Formula 55 with the one represented by Chemical Formula 2. When a dc current voltage of eight volts was charged between the anode and the cathode of the organic EL device thus obtained, it was emitted a red luminescence having a brightness of 1,010 cd/m$^2$.

EXAMPLE 15

Organic EL device

An organic EL device was prepared similarly as in Example 10 except for, in the preparation of luminous layer 4 in Example 10, replacing the pyran derivative represented by Chemical Formula 8 with the one represented by Chemical Formula 2. When energized with a dc current voltage of eight volts was charged between the anode and the cathode of the organic EL device thus obtained, it was emitted a red luminescence having a brightness of 622 cd/m$^2$.

EXAMPLE 16

Organic EL Device

An organic EL device was prepared similarly as in Example 10 except for, in the preparation of luminous layer 4 in Example 10, using a co-evaporating membrane made of the compound represented by Chemical Formula 58 and the pyran derivative represented by Chemical Formula 36, where the one represented by Chemical Formula 36 was set to a concentration of 5 w/w %. When a dc current voltage of eight volts was charged between the anode and the cathode of the organic EL device thus obtained, it was emitted a red luminescence having a brightness of 867 cd/m$^2$.

EXAMPLE 17

Organic EL Device

An organic EL device was prepared similarly as in Example 10 except for, in the preparation of luminous layer 4 in Example 10, using a co-evaporating membrane made of the compound represented by Chemical Formula 82 and the pyran derivative represented by Chemical Formula 55, where the one represented by Chemical Formula 55 was set to a concentration of 2 w/w %. When a dc current voltage of eight volts was charged between the anode and the cathode of the organic EL device thus obtained, it was emitted a red luminescence having a brightness of 1,218 cd/m$^2$.

EXAMPLE 18

Organic EL Device

An organic EL device was prepared similarly as in Example 10 except for, in the preparation of luminous layer 4 in Example 10, using a co-evaporating membrane made of the compound represented by Chemical Formula 87 and the pyran derivative represented by Chemical Formula 26, where the one represented by Chemical Formula 26 was set to a concentration of 2 w/w %. When a dc current voltage of eight volts was charged between the anode and the cathode of the organic EL device thus obtained, it was emitted a red luminescence having a brightness of 398 cd/m$^2$.

EXAMPLE 19

Organic EL Device

An organic EL device was prepared similarly as in Example 10 except for, in the preparation of luminous layer 4 in Example 10, using a co-evaporating membrane made of the compound represented by Chemical Formula 90 and the pyran derivative represented by Chemical Formula 55, where the one represented by Chemical Formula 55 was set to a concentration of 0.5 w/w %. When a dc current voltage of eight volts was charged between the anode and the cathode of the organic EL device thus obtained, it was emitted a red luminescence having a brightness of 975 cd/m$^2$.

EXAMPLE 20

Organic EL device

As shown in FIG. 2, using the pyran derivative of the present invention represented by Chemical Formula 2 as a luminous agent, organic EL devices were formed by sequentially laying anode 2, hole injection/transportation layer 3, luminous layer 4, electron injection/transportation layer 5, and cathode 6 in this order. Namely, ITO was spattered on glass substrate 1 to form a membrane, having the sheet resistance of 20 Ω/□, as anode 2. Anode 2 was evaporated under vacuum conditions with N,N'-diphenyl-N,N'-bis(1-naphthyl)-[1,1'-biphenyl]-4,4'-diamine represented by Chemical Formula 58 to form a layer, 40 nm in thickness, as hole injection/transportation layer 3, which was closely attached to anode 2. Thereafter, the compounds represented by Chemical Formulae 73 and 2 were co-evaporated on hole injection/transportation layer 3 in a weight ratio of 99:1 to form a layer, 50 nm in thickness, as luminous layer 4, which was closely attached to hole injection/transportation layer 3. Further, luminous layer 4 was evaporated under vacuum conditions with the compound represented by Formula 95 to form a layer, 20 nm in thickness, as electron injection/transportation layer 5, which was closely attached to luminous layer 4. Thereafter, electron injection/transportation layer 5 was co-evaporated with magnesium and silver in an evaporation weight ratio of 10:1 to form a layer, 150 nm in thickness, as a cathode, which was closely attached to electron injection/transportation layer 5. When a dc current voltage of eight volts was energized between the resulting anode 2 and cathode 6, it was emitted a red luminescence having a brightness of 451 cd/m$^2$.

INDUSTRIAL APPLICABILITY

As described above, the present invention was made based on the creation of novel pyran derivatives and the finding of their industrially useful properties. Since the pyran derivatives have absorption maxima in visible region and substantially absorb visible light, they can be very useful as photosensitizers and have various uses such as photochemical polymerization by irradiating visible light such as sun light, carbon arc, high-pressure mercury lamp, xenon lamp, metalhalide lamp, luminescent lamp, tungsten lamp, argon ion laser, krypton ion laser, helium-cadmium laser, helium-neon laser, and the second harmonic wavelength by YAG laser, etc., to photopolymerizing compounds, in the presence or absence of polymerization initiators. Accordingly, the pyran derivatives of the present invention can be very useful in a variety of fields such as plates for printings in laser facsimiles, laser printers, color scanners, black and white scanners, typesettings for photography, plate-makings for flat-board, plate-makings for photogravure, plate-makings for flexo, and plate-makings for silk screen, etc; printings, publications, electrons, information-recordings, chemicals, metals, cars, shipbuildings, and medical treatments, which require photosensitization by visible light as an essential technical element.

Because the pyran derivatives of the present invention have distinctive luminous ability in visible region, particularly, in a red region, they can be very useful as host luminescent agents in organic EL devices, guest luminescent agents to improve the luminescent efficiency and the luminescent spectrum by doping other host luminescent agents in a negligible amount, and laser-active substances in dye lasers. In particular, the organic EL devices, comprising the pyran derivatives of the present invention, give luminescence with a good color-purity in visible region, particularly, in a red region. This is presumed that the pyran derivatives of the present invention have one or two amino groups in their molecules, and the amino group(s) satisfactorily keeps their amorphous feature in a glass condition and effectively suppresses the cohesion of materials.

The present invention with such outstanding effects and functions is a significant invention that will greatly contribute to this art.

What is claimed is:

1. A pyran derivative represented by either Formula 1 or 2:

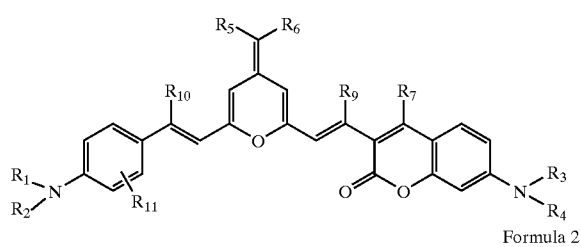

Formula 1

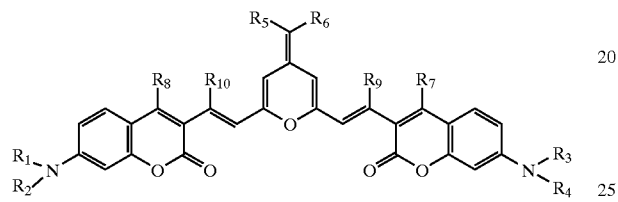

Formula 2 where, $R_1$ and $R_4$ independently represent a straight- or branched-chain of alkyl, alkenyl, or aromatic hydrocarbon group which may have a substituent; $R_5$ and $R_6$ independently represent a cyano group, halogenated alkyl group, carboxylic group or substituent derived from carbonic acid, or monocyclic or polycyclic heterocycle group, wherein the heterocycle group may have a substituent; $R_7$ and $R_8$ independently represent hydrogen, halogen, alkyl or halogenated alkyl, cyano, or carboxylic group or a substituent derived from carbonic acid; $R_9$ to $R_{11}$ independently represent hydrogen or alkyl group; $R_1$ and $R_2$, or $R_3$ and $R_4$ may form a cyclic structure along with the nitrogen to which they bound together and with benzene ring bonded to the nitrogen, respectively.

2. The pyran derivative of claim 1, which have an absorption maximum in the visible region.

3. The pyran derivative of claim 1, which have a luminescent maximum in the visible region.

4. A photopolymerizable composition which comprises the pyran derivative of claim 1.

5. The photopolymerizable composition of claim 4, which comprises a polymerization initiator and/or a binding resin, and an optionally polymerizable compound.

6. The photopolymerizable composition of claim 5, which is capable of polymerization by visible light.

7. A process for producing a pyran derivative of claim 1, comprising the step of reacting a compound, represented by Formula 3 having $R_1$, $R_2$, $R_5$, $R_6$, $R_{10}$ and $R_{11}$ in Formula 1, with a compound represented by Formula 4 having $R_3$, $R_4$, R- and $R_3$ in Formula 1:

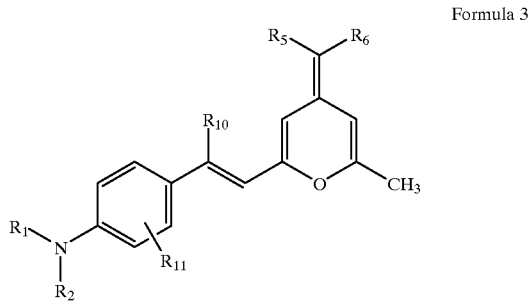

Formula 3

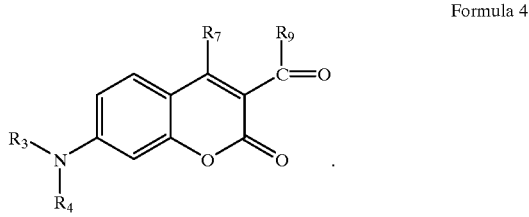

Formula 4

* * * * *